US011678555B2

United States Patent
Chung et al.

(10) Patent No.: US 11,678,555 B2
(45) Date of Patent: Jun. 13, 2023

(54) DISPLAY DEVICE HAVING TRANSMISSIVE AREA

(71) Applicant: Samsung Display Co., Ltd., Yongin-si (KR)

(72) Inventors: Jin Koo Chung, Suwon-si (KR); Seong-Min Kim, Yongin-si (KR); Beohm Rock Choi, Seoul (KR); Young Seo Park, Yongin-si (KR); Gi-Na Yoo, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 386 days.

(21) Appl. No.: 16/888,080

(22) Filed: May 29, 2020

(65) Prior Publication Data

US 2021/0057494 A1    Feb. 25, 2021

(30) Foreign Application Priority Data

Aug. 20, 2019 (KR) ........................ 10-2019-0101909

(51) Int. Cl.
*H01L 27/32* (2006.01)
*H01L 51/52* (2006.01)

(52) U.S. Cl.
CPC ...... *H01L 27/3223* (2013.01); *H01L 27/3262* (2013.01); *H01L 51/5218* (2013.01); *H01L 51/5234* (2013.01)

(58) Field of Classification Search
CPC combination set(s) only.
See application file for complete search history.

(56) References Cited

U.S. PATENT DOCUMENTS

| 2012/0074435 | A1 | 3/2012 | Ha et al. | |
|---|---|---|---|---|
| 2015/0102306 | A1 | 4/2015 | Shi et al. | |
| 2016/0336530 | A1 | 11/2016 | Zhang et al. | |
| 2018/0198067 | A1 | 7/2018 | Kim et al. | |
| 2019/0305055 | A1* | 10/2019 | Kim | H01L 27/3248 |
| 2020/0019747 | A1 | 1/2020 | Yang et al. | |
| 2020/0194730 | A1* | 6/2020 | Park | H01L 51/5281 |

FOREIGN PATENT DOCUMENTS

| CN | 108830234 A | 11/2018 |
|---|---|---|
| CN | 109979391 A | 7/2019 |
| EP | 3091578 A1 | 11/2016 |
| KR | 10-2007-0000029 A | 1/2007 |
| KR | 10-2017-0113066 A | 10/2017 |
| KR | 10-2018-0057796 A | 5/2018 |

(Continued)

OTHER PUBLICATIONS

Liu, WO 2019/062236 A1, published Apr. 4, 2019.*

(Continued)

*Primary Examiner* — Suberr L Chi
(74) *Attorney, Agent, or Firm* — Lewis Roca Rothgerber Christie LLP

(57) ABSTRACT

A display device includes: a first display area including a first pixel area; a second display area including a second pixel area and a transmissive area adjacent to the second pixel area; a first pixel in the first pixel area; a second pixel in the second pixel area; and a dummy pixel in the transmissive area, wherein the dummy pixel includes a light emission portion emitting light on both sides.

20 Claims, 17 Drawing Sheets

(56) References Cited

FOREIGN PATENT DOCUMENTS

KR    10-2018-0083459 A    7/2018
WO       2018/196637 A1    11/2018

OTHER PUBLICATIONS

Partial machine translation of WO 2019/062236 A1, published 2019.*
EPO Extended European Search Report dated Dec. 14, 2020, for corresponding European Patent Application No. 20186699.3 (8 pages).

* cited by examiner

DISPLAY DEVICE HAVING TRANSMISSIVE AREA

CROSS-REFERENCE TO RELATED APPLICATION

The present application claims priority to and the benefit of Korean Patent Application No. 10-2019-0101909 filed on Aug. 20, 2019 in the Korean Intellectual Property Office, the entire content of which is incorporated herein by reference.

BACKGROUND

1. Field

Aspects of some example embodiments of the present disclosure relate to a display device.

2. Description of the Related Art

A display device may include an optical device such as a sensor or a camera. The optical device may be located in a bezel area (e.g., an area surrounding a screen) of the display device in order to avoid interference with the screen.

If the bezel of the display device is reduced in size, a screen-to-body ratio of the display device, that is, a ratio that the screen occupies when the display device is viewed from the front, may be increased. The screen-to-body ratio may be generally perceived by consumers as an indicator in the technological quality of the display device and simultaneously may influence consumers' choices when deciding products to purchase or utilize. However, it may be difficult to position optical devices in the bezel area when the bezel of the display device is relatively small.

The above information disclosed in this Background section is only for enhancement of understanding of the background of the invention and therefore it may contain information that does not constitute prior art.

SUMMARY

Aspects of some example embodiments may improve the display quality and lifespan of the display device while positioning an optical device (e.g., a camera or sensor) in the screen or display area of the display device.

A display device according to some example embodiments includes: a first display area including a first pixel area; a second display area including a second pixel area and a transmissive area adjacent to the second pixel area; a first pixel in the first pixel area; a second pixel in the second pixel area; and a dummy pixel in the transmissive area, wherein the dummy pixel includes a light emission portion emitting light on both sides.

According to some example embodiments, a pixel density of the second display area may be smaller than a pixel density of the first display area.

According to some example embodiments, the dummy pixel may be electrically connected to the second pixel.

According to some example embodiments, the dummy pixel may represent the same color as the second pixel.

According to some example embodiments, a plurality of second pixels may be in the second pixel area, and a plurality of dummy pixels corresponding to the plurality of second pixels may be in the transmissive area.

According to some example embodiments, the second pixel may include a transistor and a first light-emitting element, the dummy pixel may include a second light-emitting element, and the second light-emitting element may be electrically connected to the transistor of the second pixel.

According to some example embodiments, the display device may further include a capping layer covering the first light-emitting element and the second light-emitting element. The capping layer may include a first portion overlapping the first light-emitting element and second a portion overlapping the second light-emitting element and a thickness of the first portion may be smaller than a thickness of the second portion.

According to some example embodiments, the first light-emitting element may include a first electrode, a second electrode, and a light emission member between the first electrode and the second electrode, the second light-emitting element may include a first electrode, a second electrode, and a light emission member between the first electrode and the second electrode, and the first electrode of the second light-emitting element may be electrically connected to the first electrode of the first light-emitting element.

According to some example embodiments, the second electrode of the first light-emitting element and the second electrode of the second light-emitting element may continuously extend over the second pixel area and the transmissive area.

According to some example embodiments, the light emission member of the first light-emitting element and the light emission member of the second light-emitting element may continuously extend over the second pixel area and the transmissive area.

According to some example embodiments, the first electrode of the first light-emitting element may be a reflective electrode, and the first electrode of the second light-emitting element may be a transparent electrode.

According to some example embodiments, the first electrode of the first light-emitting element may include a first layer and a second layer, and the second layer may be integrally formed with the first electrode of the second light-emitting element.

According to some example embodiments, the first layer may be reflective and the second layer may be transmissive.

According to some example embodiments, the planar shape of the light emission portion of the first pixel and the planar shape of the light emission portion of the second pixel may be different from each other.

According to some example embodiments, the display device may further include an optical device overlapping the second display area, and the second display area may have higher transmittance than the first display area.

A display device according to some example embodiments includes: a pixel area including a pixel including a first light-emitting element and a transistor; and a transmissive area adjacent to the pixel area and including a dummy pixel including a second light-emitting element. Each of the first light-emitting element and the second light-emitting element includes a first electrode, a light emission member on the first electrode, and a second electrode on the light emission member, and the first electrode and the second electrode of the second light-emitting element are transparent electrodes.

According to some example embodiments, the first electrode of the first light-emitting element and the first electrode of the second light-emitting element may be electrically connected to the transistor.

According to some example embodiments, the first electrode of the first light-emitting element may include a first layer and a second layer located on the first layer, and the second layer may be integrally formed with the first electrode of the second light-emitting element.

According to some example embodiments, the display device may further include a capping layer covering the first light-emitting element and the second light-emitting element, and the capping layer may include a portion overlapping the first light-emitting element and having a first thickness and a portion overlapping the second light-emitting element and having a second thickness that is smaller than the first thickness.

According to some example embodiments, an area ratio of the transmissive area of the pixel area may be 1:n, 1:2n−1, or $1:2^n-1$, wherein n is a natural number.

According to embodiments, the display device including the optical device may improve display quality and lifespan while positioning an optical device (e.g., a camera) in a screen or display area of the display device. The characteristics of example embodiments are not limited thereto, however, and further details and characteristics of embodiments according to the present disclosure are illustrated and described in the description that follows.

DETAILED DESCRIPTION

Figure 1:
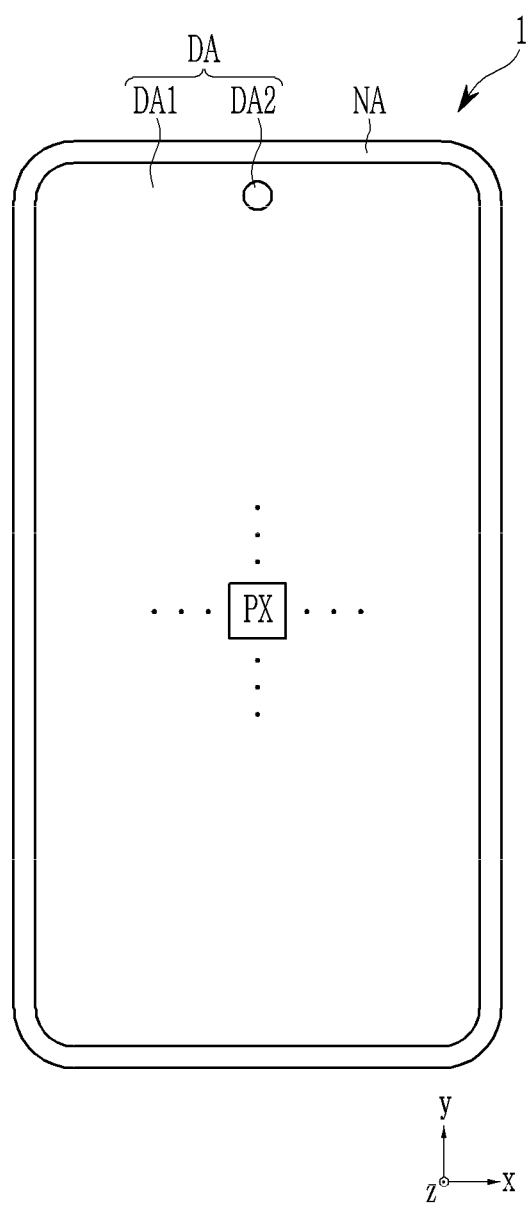
FIG. 1 is a schematic top plan view of a display device according to some example embodiments.

As those skilled in the art would realize, various aspects of the described example embodiments may be modified in various different ways, all without departing from the spirit or scope of embodiments according to the present invention.

As those skilled in the art would realize, the described example embodiments may be modified in various different ways, all without departing from the spirit or scope of embodiments according to the present invention.

Further, sizes and thicknesses of constituent members shown in the accompanying drawings are arbitrarily given for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout the specification, the same or similar constituent elements are given the same reference symbols or reference numerals.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means viewing an object portion from the top (e.g., in a direction perpendicular or normal to a plane, for example, the plane of the display surface), and the phrase "in a cross-sectional view" means viewing a cross-section of which the object portion is vertically cut from the side.

In the drawings, a symbol x is used to indicate a first direction, y is a second direction that is perpendicular to the first direction, and z is a third direction that is perpendicular to the first direction and the second direction.

An emissive display device is described as an example of a display device according to example embodiments with reference to accompanying drawings.

Figure 2:
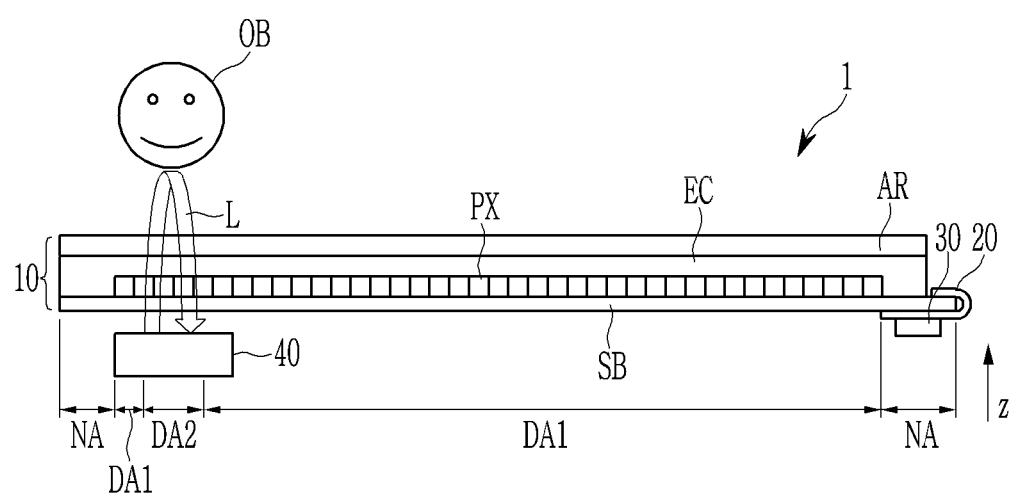
FIG. 2 is a schematic cross-sectional view of a display device according to some example embodiments.

FIG. 1 is a schematic top plan view of a display device according to some example embodiments, and FIG. 2 is a schematic cross-sectional view of a display device according to some example embodiments.

Referring to FIG. 1 and FIG. 2, a display device 1 may include a display panel 10, a flexible printed circuit film 20 connected to the display panel 10, a driving device including an integrated circuit chip 30 and the like, and an optical device 40.

The display panel 10 may include a display area DA for displaying an image and a non-display area NA in which the image is not displayed. The display area DA may correspond to a display screen or display panel comprising a plurality of pixels PX configured to various colors of light in order to display static or video images.

In the display area DA, the pixels PX are arranged in a matrix arrangement (e.g., in rows and columns). Here, each pixel PX is a minimum unit constituting the screen for displaying an image, and each pixel PX may display one of a specific color, for example, one of red, green, and blue, with various luminances according to an input image signal. In the non-display area NA, various circuits, components, and/or signal lines may be positioned for generating and/or transmitting various signals applied to the components (e.g., pixels PX) in the display area DA. Signal lines such as gate lines, data lines, driving voltage lines, and the like are connected to each pixel PX, and the pixels PX may receive a gate signal, a data voltage, a driving voltage, and the like from these signal lines.

According to some example embodiments, the display area DA includes a first display area DA1 and a second display area DA2. According to some example embodiments, the second display area DA2 has higher transmittance than the first display area DA1 so that it may perform other functions besides a unique function of displaying an image. Here, the transmittance means transmittance of light passing through the display panel 10 in the third direction z. The light may be a visible light and/or light of a wavelength other than visible light, for example infrared light. The second display area DA2 may have a smaller density of the pixels PX, that is, the number of pixels PX per unit area, than the first display area DA1.

In the display area DA, the second display area DA2 may be arranged in various ways. In the illustrated example embodiment, the second display area DA2 is located entirely within the first display area DA1 and surrounded by the first display area DA1. According to some example embodiments, however, the second display area DA2 may be arranged such that it overlaps with, or is in contact with the non-display area NA. That is, according to some example embodiments, the second display area DA2 may extend at least partially outside of the first display area DA1 such that the second display area DA2 is only partially surrounded on part of its edge or edges by the first display area DA1. According to various embodiments, the second display area DA2 may be located at various locations relative to the first display area DA1, for example, at a left, right, and/or central area of the first display area DA1 along the x-direction, and may further be located at the upper end, lower end, or central area of the display area DA along the y-direction. The second display area DA2 may be formed such that it is divided into or located at two or more areas. For example, according to some example embodiments, there may be a plurality of second display areas DA2. The second display area DA2 may completely cross the upper end of the display area DA and then be arranged along the first direction x. The second display area DA2 may be arranged along the second direction y across the left end and/or the right end of the display area DA. The second display area DA2 may have various shapes (e.g., a polygon shape, such as a quadrangle, a triangle, a circle, and an ellipse).

According to some example embodiments, a driving device (a driving unit) for generating and/or processing the various signals for driving the display panel 10 may be positioned in the non-display area NA of the display panel 10. The driving device may include a data driver applying a data voltage to the data lines, a gate driver applying a gate signal to the gate lines, and a signal controller controlling the data driver and the gate driver. The gate driver may be integrated in the display panel 10, and may be located at both left and right sides or one side of the display area DA. The data driver and the signal controller may include an integrated circuit chip (referred to as a driving IC chip) 30, and the integrated circuit chip 30 may be mounted on a flexible printed circuit film 20 and electrically connected to the display panel 10. The integrated circuit chip 30 may be mounted in the non-display area NA of the display panel 10.

The display panel 10 includes a substrate SB, and the pixels PX are formed or positioned on the substrate SB. The substrate SB may extend continuously (e.g., as a contiguous layer) over the first display area DA1 and the second display area DA2. The display panel 10 may include an encapsulation layer EC covering the pixels PX as a whole.

The encapsulation layer EC seals the first display area DA1 and the second display area DA2 to prevent or reduce instances of moisture, oxygen, or other contaminants penetrating into the display panel 10. When the encapsulation layer EC is in a form of a substrate, the substrate SB and the encapsulation layer EC may be bonded by a sealing member or sealing material. An antireflection layer AR may be arranged on the encapsulation layer EC to reduce external light reflection, and the antireflection layer AR may include a polarization layer and/or a phase retardation layer.

The optical device 40 may be positioned or mounted at the back of the display panel 10 (e.g., at a side of the display panel 10 that is opposite the display surface of the display panel 10). The optical device 40 may be, for example, a sensor, a camera, a flash, or the like. When the optical device 40 is a sensor, the optical device 40 may be a proximity sensor or an illuminance sensor. Light at the wavelength used by the optical device 40 may pass through the display panel 10 with a higher transmittance through the second display area DA2. In addition to the optical device 40, a variety of electronic devices may be positioned at the back of the display panel 10.

The optical device 40 may emit light L having a wavelength range (e.g., a set or predetermined wavelength range) toward an object OB (e.g., an external object such as a user) located in front of the display panel 10, or receive light L reflected from the object OB. The light L in this wavelength range (e.g., the set or predetermined wavelength range) is light at a wavelength that may be processed in the optical device 40, and may be visible light and/or infrared light. The light of the wavelength (e.g., the set or predetermined wavelength) may pass primarily through the transmissive area located at the second display area DA2. When the optical device 40 uses infrared light, light of the wavelength (e.g., the set or predetermined wavelength) may have a wavelength in a range of about 900 nm to 1000 nm. The optical device 40 may receive light of the wavelength (e.g., the set or predetermined wavelength) irradiated to the front of the display panel 10. The optical device 40 may be located at a position corresponding to the entire second display area DA2, or may be located at a position corresponding to a portion of the second display area DA2. A plurality of the optical devices 40 may be located at the second display area DA2.

The first display area DA1 and the second display area DA2 of the display device 1 according to some example embodiments are now described in more detail with reference to FIG. 3 and FIG. 4 along with the above-described drawings.

Figure 3:
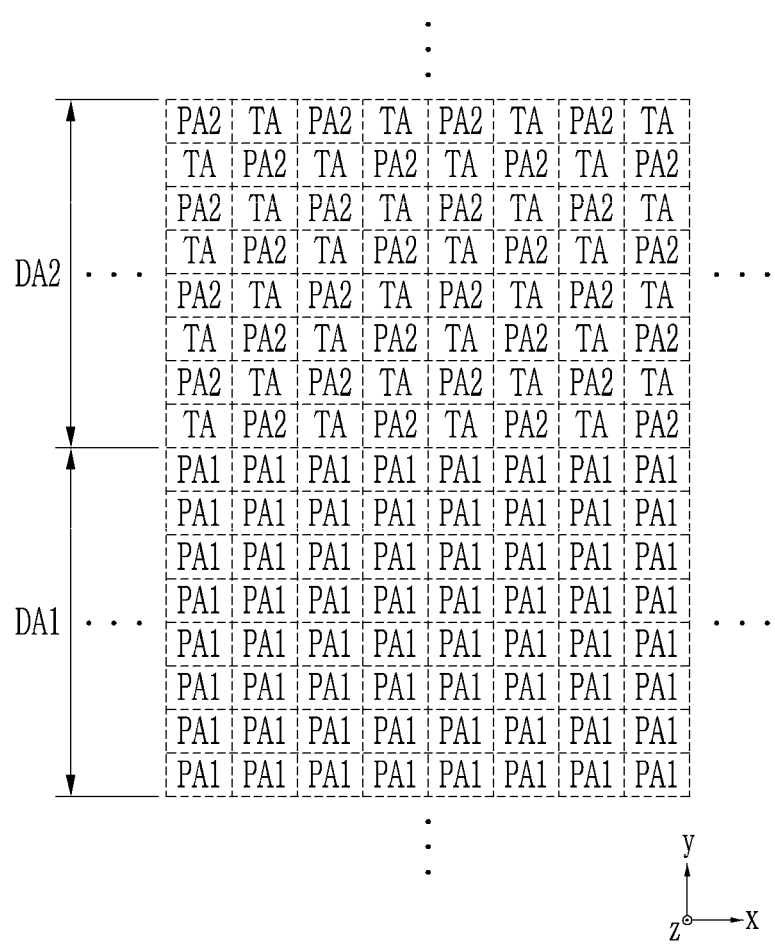
FIG. 3 and FIG. 4 are schematic layout views of a first display area and a second display area of a display device according to some example embodiments.
Figure 4:
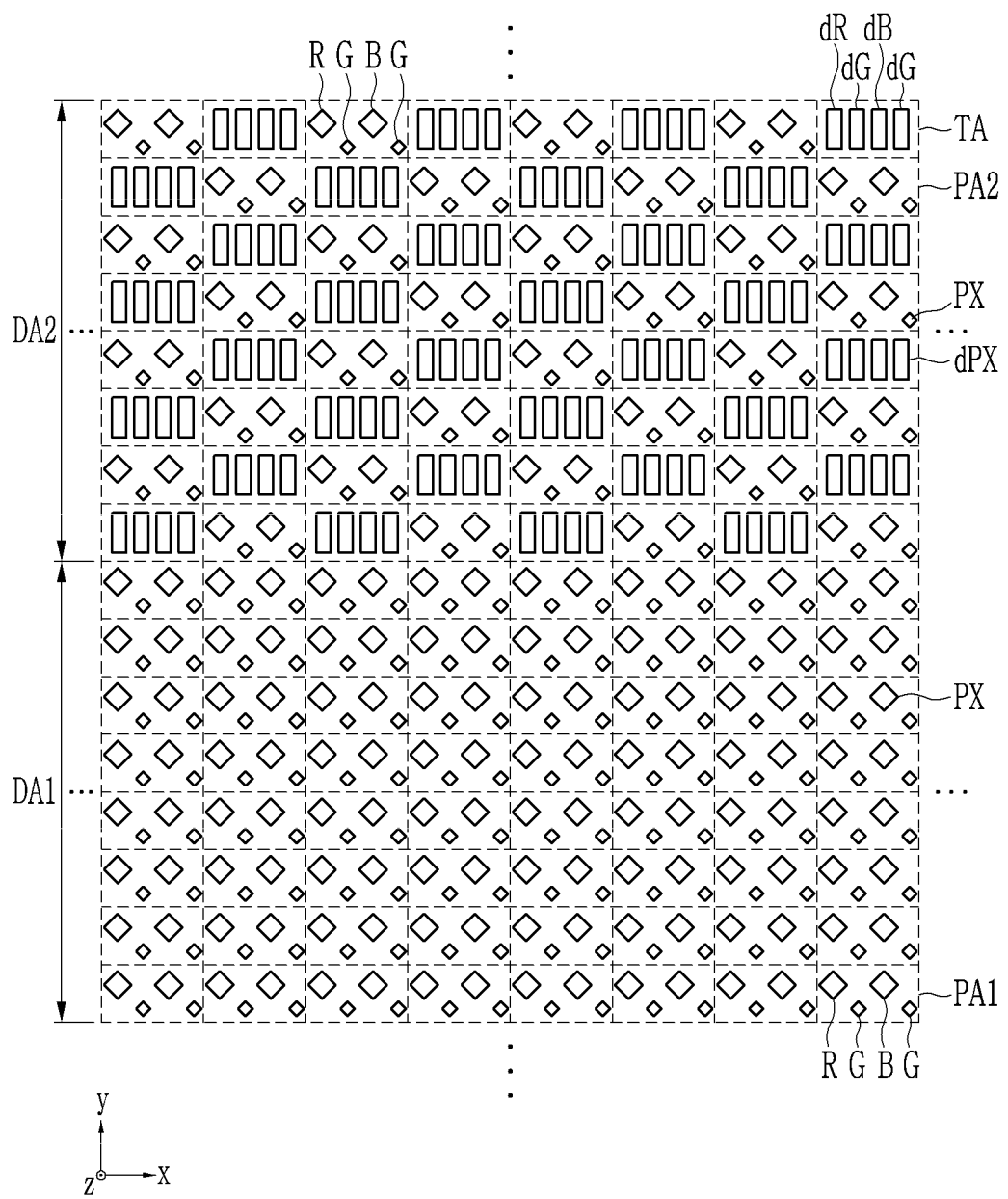

FIG. 3 and FIG. 4 are layout views of the first display area DA1 and the second display area DA2 of the display device 1 according to some example embodiments. FIG. 3 shows the schematic arrangement of the pixel areas PA1 and PA2 and the transmissive area TA, and FIG. 4 illustrates the pixels PX and dummy pixels dPX that may be included in the pixel areas PA1 and PA2 and the transmissive area TA in more detail.

Referring to FIG. 3, the first display area DA1 includes the first pixel areas PA1, and the second display area DA2 includes the second pixel areas PA2 and the transmissive areas TA. The size of one first pixel area PA1 and the size of one second pixel area PA2 may be the same or different.

In the first display area DA1, the first pixel areas PA1 may be arranged in a matrix arrangement (e.g., columns and rows of first pixel areas PA1 extending in the first direction x and the second direction y that are the different directions). In the second display area DA2, the second pixel areas PA2 and transmissive areas TA may be arranged in a matrix arrangement (e.g., alternating along rows and columns extending in the first direction x and the second direction y). According to some example embodiments, the second pixel areas PA2 and the transmissive areas TA may be arranged in a checkerboard pattern so that the second pixel areas PA2 and transmissive areas TA may be evenly mixed. That is, transmissive areas TA may be adjacent around one second pixel area PA2 in one direction x and the second direction y, and the second pixels may be adjacent around one transmissive area TA. At least one second pixel area PA2 and at least one transmissive area TA may be alternately arranged in the first direction x and/or the second direction y. Embodiments according to the present disclosure are not limited to alternating second pixel areas PA2 and transmissive areas TA, however, and according to some example embodiments, there may be more than one second pixel area PA2 for every transmissive area TA, or vice versa, in a column and/or a row direction.

The size of one second pixel area PA2 and the size of one transmissive area TA may be the same or different. The size of each transmissive area TA may be the same or different. The arrangement and size of the second pixel areas PA2 and the transmissive areas TA may be varied. For example, according to some example embodiments, in the second display area DA2, an area ratio of the transmissive area TA for the second pixel area PA2 is about 1:1, and the transmissive area TA may be formed with various area ratios such as about 1:2, 1:3, 1:7, 1:8, 1:15, etc. For example, the area ratio of the transmissive area TA for the second pixel area PA2 may be about 1:n, about 1:(2n−1), or about 1:($2^n$−1) (here, n is a natural number).

Each pixel area PA1 and PA2 may include at least one pixel PX. The pixel PX may include a pixel circuit and a light emission portion. The pixel circuit may include a transistor, a capacitor, etc. as components for driving a light-emitting element such as a light emitting diode. The light emission portion is an area in which light emitted from the light-emitting element is emitted. The pixel PX shown in FIG. 4 may correspond to the light emission portion. The pixel PX may emit the light in one direction, that is, the third direction z.

The transmissive area TA may include at least one dummy pixel dPX. Differently from the pixel PX included in the pixel areas PA1 and PA2, the dummy pixel dPX may only include the light emission portion without including the pixel circuit. The dummy pixel dPX shown in FIG. 4 may correspond to the light emission portion. The dummy pixel dPX may emit or transmit the light in both directions, that is, the third direction z and the direction −z opposite thereto.

The shape of the light emission portion of the pixel PX and the shape of the light emission portion of the dummy pixel dPX may be the same (or substantially the same) or different. According to some example embodiments, the shape of the light emission portion of the pixel PX is a rhombus, and the shape of the light emission portion of the dummy pixel dPX is a rectangle.

Because the dummy pixel dPX does not include the pixel circuit that may otherwise obstruct or block the light transmission, the transmittance of the dummy pixel dPX may be higher than that of the pixel PX. The light-emitting element of the dummy pixel dPX may be electrically connected to the pixel circuit of the adjacent pixel PX. Accordingly, the dummy pixel dPX may be driven together with the pixel PX that includes the pixel circuit electrically connected to the dummy pixel dPX. At least one transmissive area TA may not include the dummy pixel dPX. Thus, according to some example embodiments, one or more of the transmissive areas TA may include a dummy pixel dPX without including a pixel circuit, and the dummy pixel dPX may include one or more light-emitting elements that are electrically connected to a pixel circuit of an adjacent pixel area PA2, such that the light-emitting element (e.g., an OLED) of the dummy pixel dPX may be driven by the pixel circuit of the adjacent pixel area PA2. By not including the pixel circuit in the dummy pixel dPX, the dummy pixel dPX may be enabled to transmit light at a location where a pixel circuit would otherwise be located. Additionally, according to some example embodiments, the dummy pixel dPX may not include a light-emitting element such that the dummy pixel dPX may be enabled to transmit light at a location where the light-emitting element would otherwise be located.

Even if the second display area DA2 has a smaller pixel density than the first display area DA1, because the dummy pixel dPX is located in the transmissive area TA, the second display area DA2 may have a larger aperture ratio than the first display area DA1. Here, the aperture ratio refers to the ratio that the light emission portion occupies in the display area.

Because the second display area DA2 has a smaller pixel density than the first display area DA1, disharmony or incongruity may occur between the first display area DA1 and the second display area DA2 when the image is displayed over the entire display area DA including the second display area DA2. For example, the second display area DA2 may be displayed darker than the first display area DA1. By increasing the luminance of the pixels PX of the second pixel area PA2, the disharmony may be improved (e.g., counteracted or reduced) by making the luminance of the second display area DA2 similar to or substantially the same as the luminance of the first display area DA1. However, in this case, the lifespan of the pixels PX of the second pixel area PA2 may be reduced. According to some example embodiments, because the dummy pixels dPX are located in the transmissive area TA of the second display area DA2 to be emitted together with the pixels PX of the second pixel area PA2, the disharmony between the first display area DA1 and the second display area DA2 may be improved (e.g., counteracted or reduced) even if the luminance of the pixels in the second pixel area PA2 is not increased or excessively increased.

According to some example embodiments, as shown in FIG. 3 and FIG. 4, each first pixel area PA1 includes one red pixel R, two green pixels G, and one blue pixel B. Each second pixel area PA2 includes one red pixel R, two green pixels G, and one blue pixel B. Each transmissive area TA includes one dummy red pixel dR, two dummy green pixels dG, and one dummy blue pixel dB. Unlike the illustrated example, the pixel arrangement of the first pixel area PA1 and the pixel arrangement of the second pixel area PA2 may be different, and the pixel arrangement of the second pixel area PA2 may be different from the dummy pixel arrangement of the transmissive area TA.

A group of the pixels R, G, and B included in each pixel area PA1 and PA2 may be referred to as a unit pixel, and a group of the dummy pixels dR, dG, and dB included in each transmissive area TA may be referred to as a unit dummy pixel. The configuration of the unit pixel of the first pixel area PA1 and the configuration of the unit pixel of the second pixel area PA2 may be the same or different. The unit pixel may include one red pixel R, one green pixel G, and one blue pixel B. The unit pixel may include at least one among the red pixel R, the green pixel G, and the blue pixel B, and may include a white pixel.

The pixels R, G, and B included in the first display area DA1 may be arranged in a pixel row extending in the first direction x. The pixels R, G, and B included in the second display area DA2 and the dummy pixels dR, dG, and dB included in the transmissive area TA also may be arranged in a pixel row extending in the first direction x. FIG. 3 and FIG. 4 show 16 pixel rows, however the display area DA may include any suitable number of pixel rows according to a design of the display device, corresponding to a desired image resolution (e.g., a set or predetermined resolution).

In the first display area DA1, the pixels R, G, and B are arranged approximately in a line in the first direction x in each pixel row. In each pixel row, the pixels R, G, and B may be repeatedly arranged in an order of the red pixel R, the green pixel G, the blue pixel B, and the green pixel G in the first direction x. The arrangement of the pixels R, G, and B included in one pixel row maybe variously changed. For example, the pixels R, G, and B may be repeatedly arranged in the first direction x in an order of the blue pixel B, the green pixel G, the red pixel R, and the green pixel G, or may be repeatedly arranged in an order of the red pixel R, the blue pixel B, the green pixel G, and the blue pixel B. Embodiments according to the present disclosure, however, are not limited thereto, and the order or arrangement of the pixels R, G, and B may vary according to the design of various embodiments.

In the second display area DA2, the pixels R, G, and B and the dummy pixels dR, dG, and dB are arranged approximately in one line in the first direction x in each pixel row. In each pixel row, the pixels R, G, and B and the dummy pixels dR, dG, and dB may be arranged repeatedly in an order of the red pixel R, the green pixel G, the blue pixel B, the green pixel G, the dummy red pixel dR, the dummy green pixel dG, the dummy blue pixel dB, and the dummy green pixel dG in the first direction x. The arrangement of the pixels R, G, and B included in one pixel row maybe variously changed.

The pixels R, G, and B of the first and second pixel area PA1 and PA2 and the dummy pixels dR, dG, and dB of the transmissive area TA also may be arranged along a pixel column in the second direction y. FIG. 3 and FIG. 4 show 16 pixel columns, however the display area DA may include any suitable number of pixel columns according to a desired image resolution (e.g., a set or predetermined resolution). In each pixel column, the pixels R, G, and B and the dummy pixels dR, dG, and dB are arranged approximately in one line in the second direction y. In each pixel column, pixels PX of two or more colors in the second direction y may be alternately arranged along the second direction y in the first display area DA1, and the pixels PX and the dummy pixels dPX of the same color may be arranged along the second direction y in the second display area DA2. For example, in FIG. 4, in the pixel column shown on the far left, the blue pixel B and the red pixel R may be alternately arranged along the first display area DA1, and the red pixel R and the dummy red pixel dR may be arranged along the second display area DA2. The arrangement of the pixels R, G, and B and the dummy pixels dR, dG, and dB included in one pixel column may be variously changed.

Figure 5:
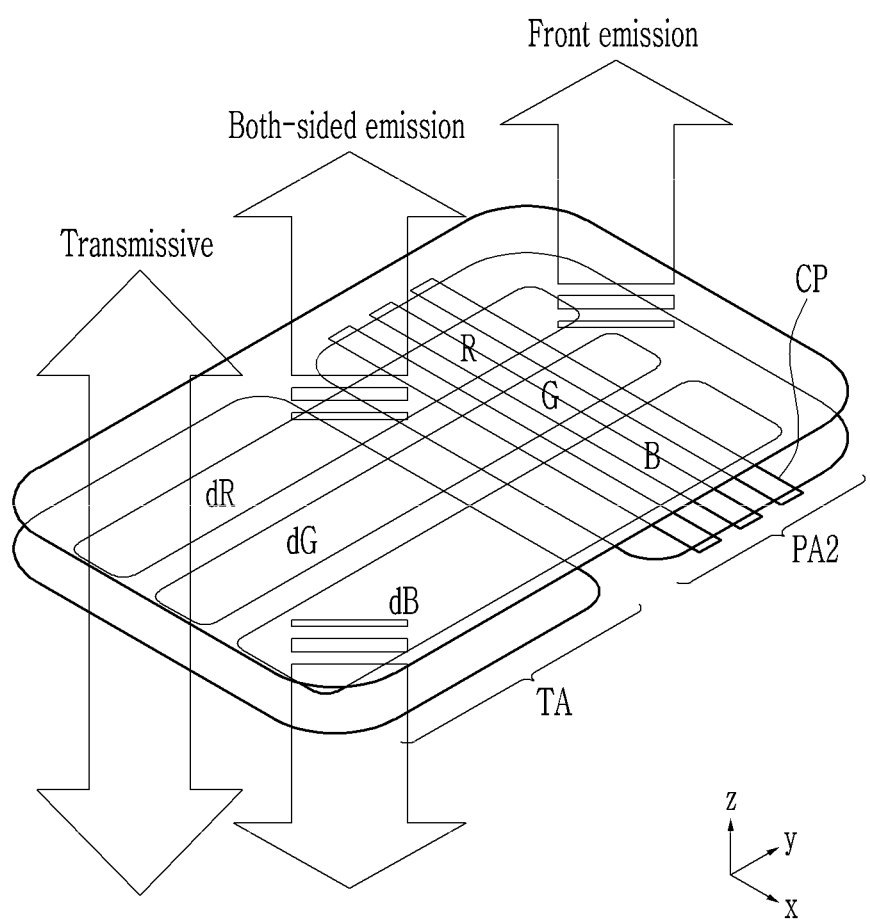
FIG. 5 is a diagram view of a pixel and a dummy pixel of a second display area in a display device according to some example embodiments.

FIG. 5 is a schematic view in the pixel PX and the dummy pixel dPX of the second display area DA2 in the display device according to some example embodiments. FIG. 5 shows the second pixel area PA2 and the transmissive area TA adjacent in the second direction y in the second display area DA2.

Referring to FIG. 5, the second pixel area PA2 includes the red pixel R, the green pixel G, and the blue pixel B one by one, and the transmissive area TA includes the dummy red pixel R, the dummy green pixel G, and the dummy blue pixel B one by one. A pixel circuit PC for driving the light-emitting elements of the pixels R, G, and B of the second pixel area PA2 may be located in the second pixel area PA2. The pixel circuit PC may not be located at or near the transmissive area TA. The pixel circuit PC may include a reflective metal layer and this metal layer may block light. Because the pixel circuit PC is not located at or near the transmissive area TA, however, the transmissive area TA may have a higher transmittance than the second pixel area PA2.

The dummy pixels dR, dG, and dB of the transmissive area TA may be electrically connected to the pixel circuit PC located in the second pixel area PA2. For example, one electrode (e.g., an anode) of the light-emitting element of each dummy pixel dR, dG, and dB of the transmissive area TA may be electrically connected to the pixel circuit PC of the corresponding pixel R, G, and B of the second pixel area PA2. Therefore, the light-emitting element of each dummy pixel dR, dG, and dB of the transmissive area TA may be emitted concurrently (e.g., simultaneously) with the corresponding pixels R, G, and B of the second pixel area PA2. The dummy pixels dR, dG, and dB of the transmissive area TA may be considered as extending the pixels R, G, and B of the second pixel area PA2 into the transmissive area. The light emission portions of each dummy pixel dR, dG, and dB may be separated from the light emission portions of the corresponding pixels R, G, and B, and may be connected to each other.

The dummy pixels dR, dG, and dB in the transmissive area TA are a double-sided emission type. That is, the light emission portion of the dummy pixels dR, dG, and dB may emit light in the third direction z and the opposite direction −z thereto. Thus, the configuration of the dummy pixels dR, dG, and dB in the double-sided emission type is to increase the transmittance of the transmissive area TA. For double-sided emission, both electrodes of the light-emitting elements of the dummy pixels dR, dG, and dB, for example, the anode and the cathode, must be transparent, so that the transmittance of the dummy pixels dR, dG, and dB, and thus the transmittance of the transmissive area TA may be increased.

The pixels R, G, and B of the second pixel area PA2 may be of a cross-sectional emission type, for example, a top emission type that emits light in the third direction z as illustrated. The pixels R, G, and B of the second pixel area PA2 may be of a bottom emission type or a double side emission type.

Figure 6:
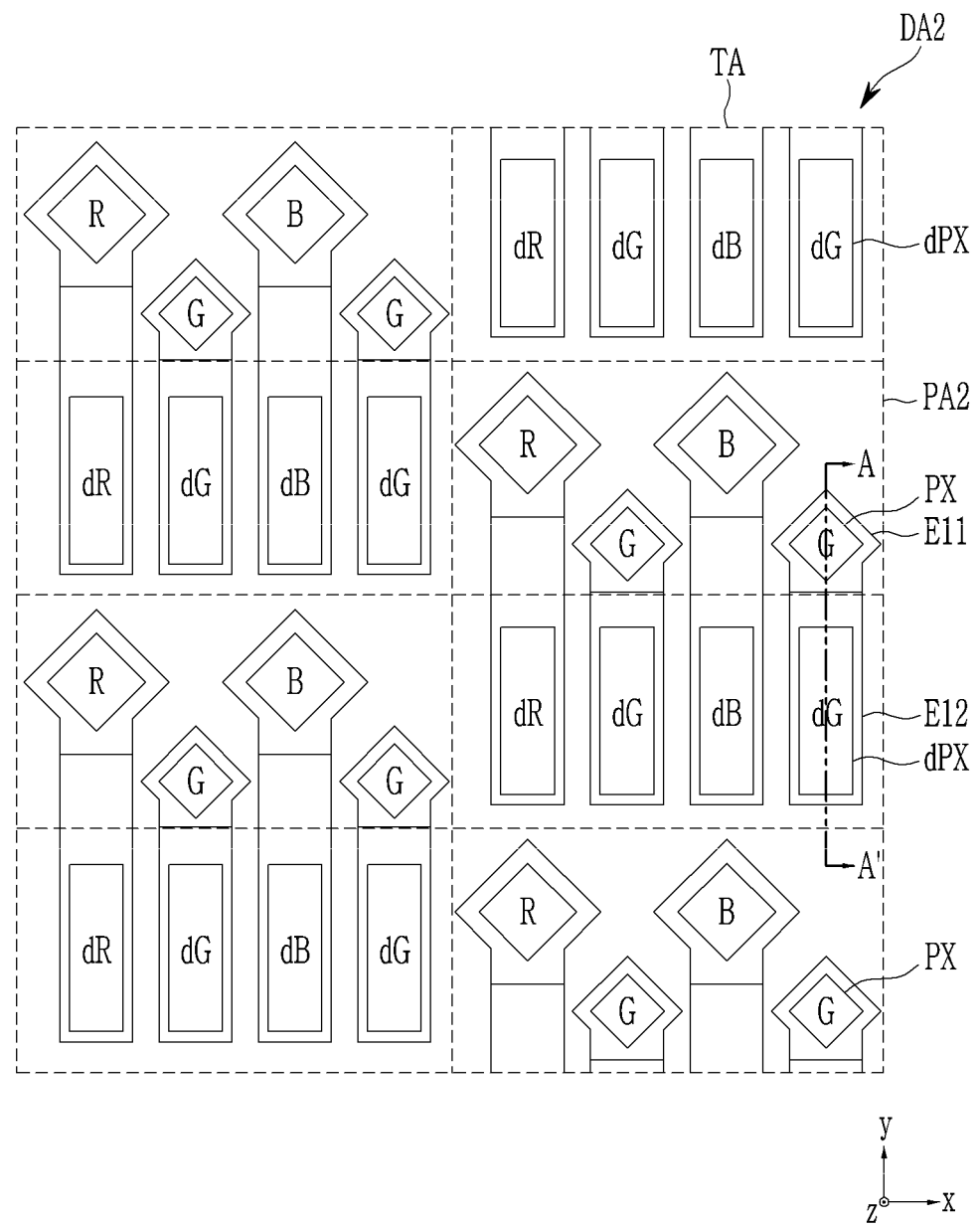
FIG. 6 is a schematic top plan view showing a part of a second display area in a display device according to some example embodiments.
Figure 7:
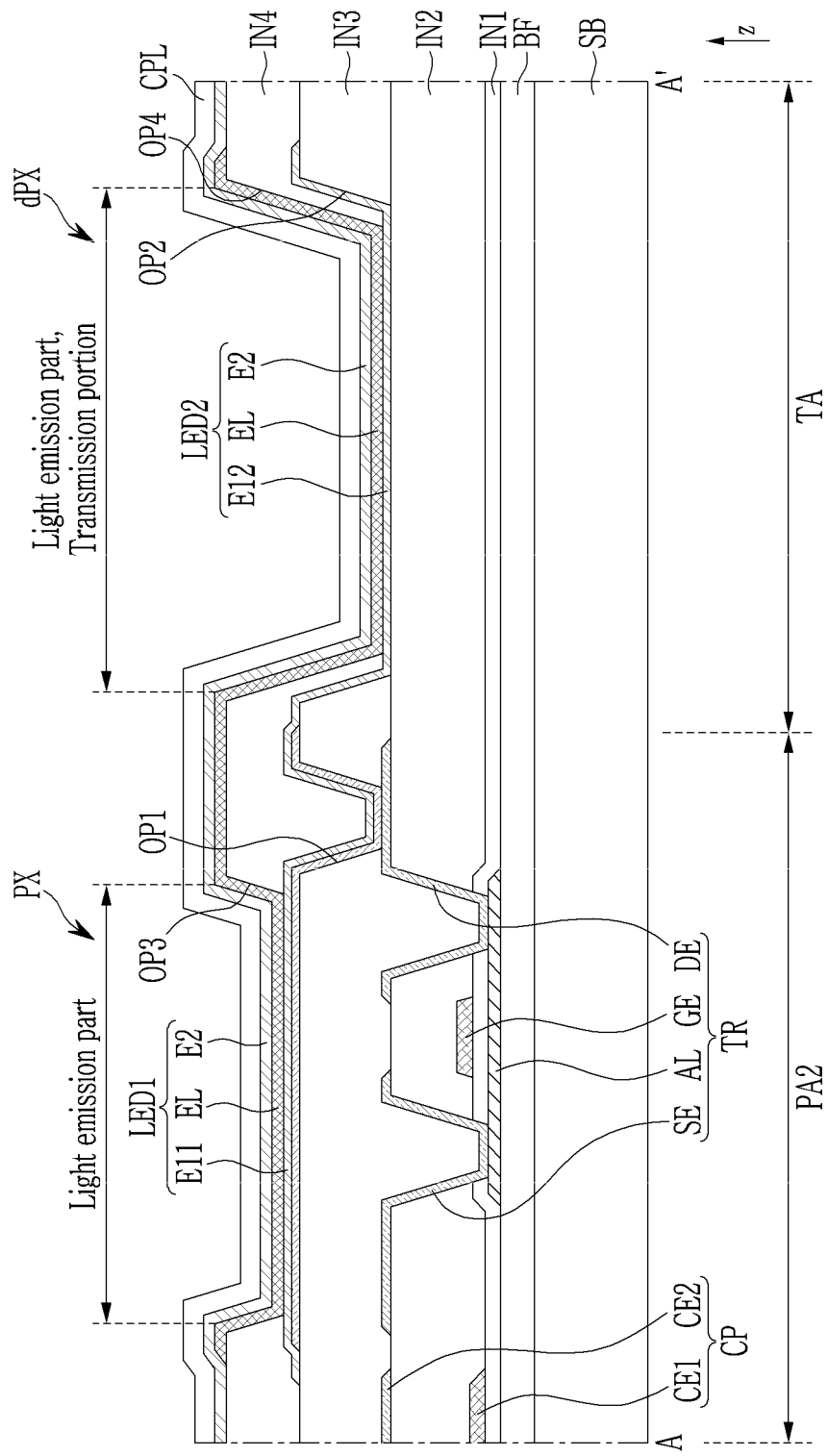
FIG. 7 is a cross-sectional view taken along a line A-A' in FIG. 6 according to some example embodiments.

FIG. 6 is a schematic top plan view showing a part of a second display area in a display device according to some example embodiments, and FIG. 7 is a cross-sectional view taken along a line A-A' in FIG. 6 according to some example embodiments.

FIG. 6 shows four second pixel areas PA2 and four transmissive areas TA adjacent in the second display area DA2. FIG. 7 shows only one transistor TR and one capacitor CP among configurations of the pixel circuit PC located in the second pixel area PA2.

Referring to FIG. 6 and FIG. 7, in the second display area DA2, the second pixel area PA2 and the transmissive area TA are adjacent to each other, the second pixel area PA2 includes the pixels R, G, and B, and the transmissive area TA includes the dummy pixels dR, dG, and dB. Each dummy pixel dR, dG, and dB is electrically connected to the corresponding pixel R, G, and B. The detailed cross-sectional structure for the dummy pixels dR, dG, and dB to be electrically connected to the pixels R, G, and B while the display device includes the second pixel area PA2 and the transmissive area TA as above-described is now described.

The display device includes the substrate SB and various layers, wires, and elements formed thereon. The elements may include the transistor TR, the capacitor CP, and light emitting diodes LED1 and LED2.

The substrate SB may include an insulating material such as a polymer such as a polyimide and a polyamide, or glass, and may be optically transparent. When the substrate SB includes a polymer layer, the substrate SB may include a barrier layer including inorganic insulating materials such as a silicon oxide (SiOx) and a silicon nitride (SiNx) to prevent or reduce instances penetration of moisture or other contaminants.

A buffer layer BF may be located on the substrate SB to prevent diffusion of impurities that may degrade the characteristics of a semiconductor layer AL and to prevent or reduce instances of penetration of moisture or other contaminants.

The semiconductor layer AL of the transistor TR may be located on the buffer layer BF. The semiconductor layer AL may include a channel area and source and drain areas on respective sides thereof. The semiconductor layer AL may include a semiconductor material such as polysilicon, amorphous silicon, an oxide semiconductor, and the like.

A first insulating layer IN1, which may include an inorganic insulating material may be located on the semiconductor layer AL. The first insulating layer IN1 may be located over the entire surface of the substrate SB, and may also be located in the transmissive area TA.

A first conductor that may include a gate electrode GE of the transistor TR, a first electrode CE1 of the capacitor CP, a gate line, and the like may be located on the first insulating layer IN1. The gate electrode GE may overlap the channel area of the semiconductor layer AL. The first conductor may include a metal or conductive material such as molybdenum (Mo), copper (Cu), aluminum (Al), silver (Ag), chromium (Cr), tantalum (Ta), titanium (Ti), etc.

A second insulating layer IN2 that may include an inorganic insulating material may be located on the first conductor. A second conductor that may include a source electrode SE and a drain electrode DE of the transistor TR, a second electrode CE2 of the capacitor CP, a data line, a driving voltage line, and the like may be located on the second insulating layer IN2. The source electrode SE and the drain electrode DE may be respectively connected to a source area and a drain area of the semiconductor layer AL through openings of the second insulating layer IN2. The second conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), etc.

The gate electrode GE, the source electrode SE, and the drain electrode DE form the transistor TR along with the semiconductor layer AL. The first electrode CE1 and the second electrode CE2 form the capacitor CP along with the insulating layer IN2 interposed therebetween. The transistor TR and the capacitor CP for configuring the pixel circuit may be located in the second pixel area PA2, but may not be located in the transmissive area TA.

A third insulating layer IN3 that may include the organic insulating material may be located on the second insulating layer IN2 and the second conductor. The third insulating layer IN3 may serve to eliminate a step to be planarized to increase light emission efficiency of the light-emitting element to be formed thereon. The third insulating layer IN3 may be arranged to cover the second insulating layer IN2 and the second conductor in the second pixel area PA2. The third insulating layer IN3 may cover the transistor TR.

The third insulating layer IN3 may be removed at at least a portion in the transmissive area TA to improve transmittance. For example, the third insulating layer IN3 may not be located in the transmissive area TA except for the periphery of the boundary part of the transmissive area TA and the second pixel area PA2. The third insulating layer IN3 may not be located or may be nearly located in the transmission portion.

In the third insulating layer IN3, the first electrode E11 of the light emitting diode LED1 of the pixel PX and the first electrode E12 of the light emitting diode LED2 of the dummy pixel dPX may be located.

In the area corresponding to the light emission portion, the first electrode E12 may be located directly on the second insulating layer IN2, and may be in contact with the second insulating layer IN2. In order to increase the transmittance of the transmissive area TA, the first electrode E12 may be a transparent electrode including a transparent conductive oxide (TCO) such as an indium tin oxide (ITO) and an indium zinc oxide (IZO). For electrical connection with the pixel circuit of the pixel PX, the first electrode E12 may extend to the second pixel area PA2.

The first electrode E11 may include a first layer and a second layer thereon. The second layer corresponds to the extending portion of the first electrode E12. Therefore, the second layer is integrally formed with the first electrode E12. The first electrode E11 may be connected to the drain electrode DE of the transistor TR through the opening OP1 of the third insulating layer IN3. Because the first electrode E12 is connected to the first electrode E11, the first electrode E12 may also be connected to the drain electrode DE, and may concurrently (e.g., simultaneously) receive the same signal as the first electrode E11. Alternately, the first layer may correspond to the portion of the first electrode E12.

The first layer of the first electrode E11 may include a metal or conductive material such as silver (Ag), lithium (Li), calcium (Ca), aluminum (Al), magnesium (Mg), and gold (Au). The first layer may be the multi-layered structure (e.g., ITO/Ag/ITO) of the transparent conductive oxide, the metal, and the transparent conductive oxide. The first layer may be reflective. Even if the second layer is transparent, because the first layer is reflective, the first electrode E11 may be a reflective electrode. By forming the first electrode E11 as a reflective electrode, the light emission efficiency of the light emitting diode LED1 may be increased. The first layer and the first electrode E11 may be transparent.

The first electrodes E11 and E12 of such a structure may be formed by various manufacturing operations including one or more of the following operations. After forming the opening OP1 overlapping the drain electrode DE of the second pixel area PA2 and the opening OP2 overlapping the light emission portion of the transmissive area TA in the third insulating layer IN3, the first layer of the first electrode E11 is formed in the second pixel area PA2. Next, the second layer covering the first layer of the first electrode E11 and the first electrode E12 are formed in the second pixel area PA2 and the transmissive area TA. In this case, the second layer and the first electrode E12 may be formed (e.g., concurrently or simultaneously) formed of the same material to be connected to each other.

The fourth insulating layer IN4 that may include the organic insulating material may be located on the third insulating layer IN3 and the first electrodes E11 and E12. The fourth insulating layer IN4 may have the opening OP3 overlapping the first electrode E11 and the opening OP4 overlapping the first electrode E12. The opening OP3 may define an area corresponding to the light emission portion of the pixel PX, and the opening OP4 may define an area corresponding to the light emission portion of the dummy pixel dPX. The opening OP4 may correspond to a transmission portion having higher transmittance in the transmissive area TA. The fourth insulating layer IN4 may cover the edges of the first electrodes E11 and E12.

A light emission member EL may be located on the first electrodes E11 and E12. The light emission member EL may include a first organic common layer, an emission layer, and a second organic common layer that are sequentially stacked. The first organic common layer may include at least one of a hole injection layer and a hole transport layer. The emission layer may include a material layer that uniquely emits light of primary colors such as red, green, and blue. The emission layer may have a structure in which a plurality of material layers emitting light of different colors are stacked. The second organic common layer may include at least one of an electron transport layer and an electron injection layer.

The light emission member EL may extend continuously (e.g., may be formed as a continuous layer) over the second pixel area PA2 and the transmissive area TA. The light emission member EL may be located only in the openings OP3 and OP4 and not on the fourth insulating layer IN4. The light emission member EL included in the light emitting diode LED1 of the pixel PX and the light emission member EL included in the light emitting diode LED2 of the dummy pixel dPX may include the same material and may be formed in the same process.

The second electrode E2 may be located on the light emission member EL. The second electrode E2 may include a transparent conductive oxide (TCO) such as an indium tin oxide (ITO) or an indium zinc oxide (IZO), and may be a transparent electrode. The second electrode E2 may extend continuously (e.g., may be formed as a continuous material or layer) over the second pixel area PA2 and the transmissive area TA. The second electrode E2 may be formed to cover the entire display area DA.

A capping layer CPL may be formed or located on the second electrode E2. The capping layer CPL may improve optical efficiency by adjusting the refractive index. The capping layer CPL may be formed to entirely cover the second electrode E2. The capping layer CPL may include the organic insulating material or may include the inorganic insulating material. An encapsulation layer may be formed on the capping layer CPL. The encapsulation layer may be a thin film encapsulation layer in which at least one inorganic layer and/or at least one organic layer are stacked on the capping layer CPL, or an encapsulation substrate combined to the substrate SB by a sealing member.

In the second pixel area PA2, the first electrode E11, the light emission member EL, and the second electrode E2 form the light-emitting element as the light emitting diode LED1. In the transmissive area TA, the first electrode E12, the light emission member EL, and the second electrode E2 form the light-emitting element as the light emitting diode LED2. The first electrodes E11 and E12 may be anodes of a hole injection electrode and the second electrode E2 may be a cathode of an electron injection electrode. In contrast, the first electrodes E11 and E12 may be the cathodes and the second electrode E2 may be the anode.

In the light emitting diode LED1, because the first electrode E11 is reflective and the second electrode E2 is transmissive, the light emitted from the light emitting diode LED1 may be emitted to the front, that is, in the third direction z. In the light emitting diode LED2, because the first electrode E12 and the second electrode E2 are both transmissive, the light emitted from the light emitting diode LED2 may be emitted in the front and the rear, that is, in the third direction z and the opposite direction −z thereto.

As illustrated, according to some example embodiments, because the configuration of the pixel circuit such as the transistor TR, the capacitor CP, and the like, which are located in the second pixel area PA2 are not located in the transmissive area TA, the transmittance of the transmissive area TA may be increased. In the transmissive area TA, the double-sided type of light emitting diode LED2 is arranged to form the dummy pixel dPX emitting the light, so that there is no need to increase or excessively increase the luminance of the light emitting diode LED1 of the second pixel area PA2 to compensate the luminance difference between the first display area DA1 and the second display area DA2. Therefore, it may be possible to prevent the lifespan of the light emitting diode LED1 of the second pixel area PA2 from being shorter than that of the light emitting diode of the first pixel area PA1. In addition, because it may not be necessary to increase the driving voltage in order to increase the luminance of the light emitting diode LED1, the power consumption may be reduced. Because the first electrode E12 and the second electrode E2 are both transparent electrodes, the light emitting diode LED2 may prevent or reduce the transmittance deterioration of the transmissive area TA of the transmissive area TA.

On the other hand, the cross-sectional structure of the first pixel area PA1 of the first display area DA1 may correspond to the cross-sectional structure of the second pixel area PA2, however the first electrode of the light emitting diode of the first pixel area PA1 may not include the second layer included in the first electrode E11 of the light emitting diode LED1.

Hereinafter, aspects of some example embodiments are described based on differences from the example embodiments described above.

Figure 8:
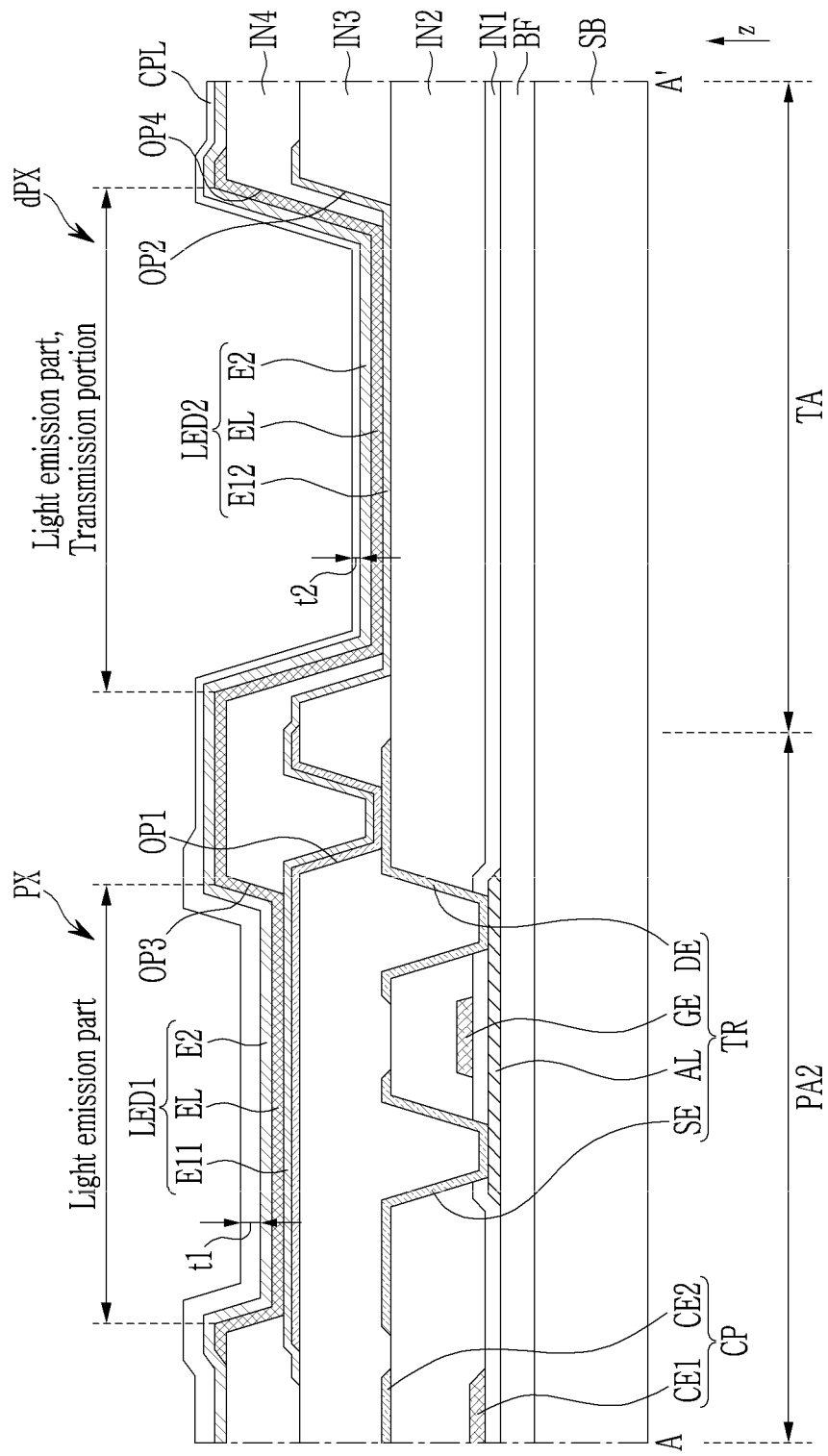
FIG. 8 is a cross-sectional view taken along a line A-A' in FIG. 6 according to some example embodiments.

FIG. 8 is a cross-sectional view taken along a line A-A' in FIG. 6 according to some example embodiments. The example embodiment of FIG. 8 is different from the example embodiment of FIG. 7 in terms of the capping layer CPL.

Referring to FIG. 8, the capping layer CPL has a first thickness t1 in the area overlapping the second pixel area PA2, for example, the light emitting diode LED1, and a second thickness t2 that is smaller than the first thickness t1 in the area overlapping the transmissive area TA, for example, the light emitting diode LED2. For example, the first thickness t1 may be about 500 to 1000 Å, and the second thickness t2 may be about 70% or less, about 50% or less, or about 30% or less of first thickness t1. As above-described, the capping layer CPL having the first thickness t1 and the second thickness t2 may be formed by selectively removing the capping layer CPL in the transmissive area TA to have the second thickness t2 by using a mask opening the transmissive area TA after forming the capping layer CPL with the first thickness t1 over the entire display area DA, for example.

According to some example embodiments, the transmittance of the transmissive area TA may be increased by forming the thin capping layer CPL in the transmissive area TA. According to some example embodiments, when the second thickness t2 of the capping layer CPL is 700 Å in the transmissive area TA, the transmittance of the transmissive part is 65.3%, however, when the second thickness t2 of the capping layer CPL is reduced to 350 Å, the transmittance of the transmission portion appears as 71.7%.

Figure 9:
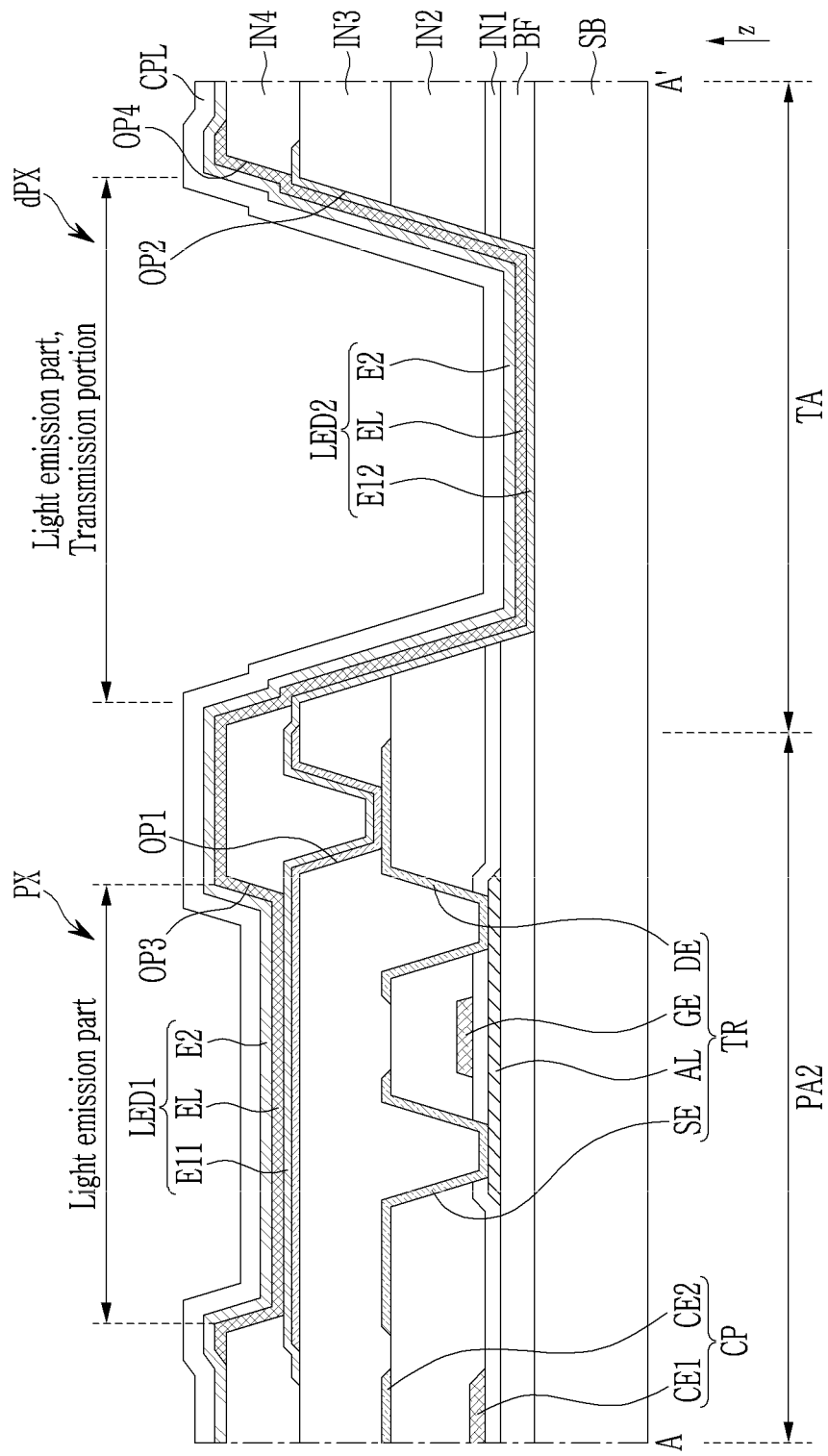
FIG. 9 is a cross-sectional view taken along a line A-A' in FIG. 6 according to some example embodiments.

FIG. 9 is a cross-sectional view taken along a line A-A' in FIG. 6 according to some example embodiments. The example embodiment of the FIG. 9 has a difference in the transmissive area TA from the cross-sectional structure shown in FIG. 7.

Referring to FIG. 9, in the transmissive area TA, as well as the third insulating layer IN3, the second insulating layer IN2, the first insulating layer IN1, and the buffer layer BF are removed at least partially. The third insulating layer IN3, the second insulating layer IN2, the first insulating layer IN1, and the buffer layer BF may not be located in the transmissive area TA except the periphery of the boundary between the transmissive area TA and the second pixel area PA2. The first electrode E12 of the light emitting diode LED2 may be located directly on the substrate SB in the area corresponding to the light emission portion, and may be in contact with the substrate SB. As such, the transmittance of the transmissive area TA may be improved by removing the buffer layer BF, the first insulating layer IN1, and the second insulating layer IN2 which may include the inorganic insulating material in the area corresponding to the transmission portion of the transmissive area TA.

Unlike as shown, at least one of the buffer layer BF and the insulating layers IN1, IN2, and IN3 in the transmissive area TA may be arranged or formed to cover the entire substrate SB without being removed. In either case, the dummy pixel dPX including the light emitting diode LED2 connected to the pixel circuit of the second pixel area PA2 may be located in the transmissive area TA.

Figure 10:
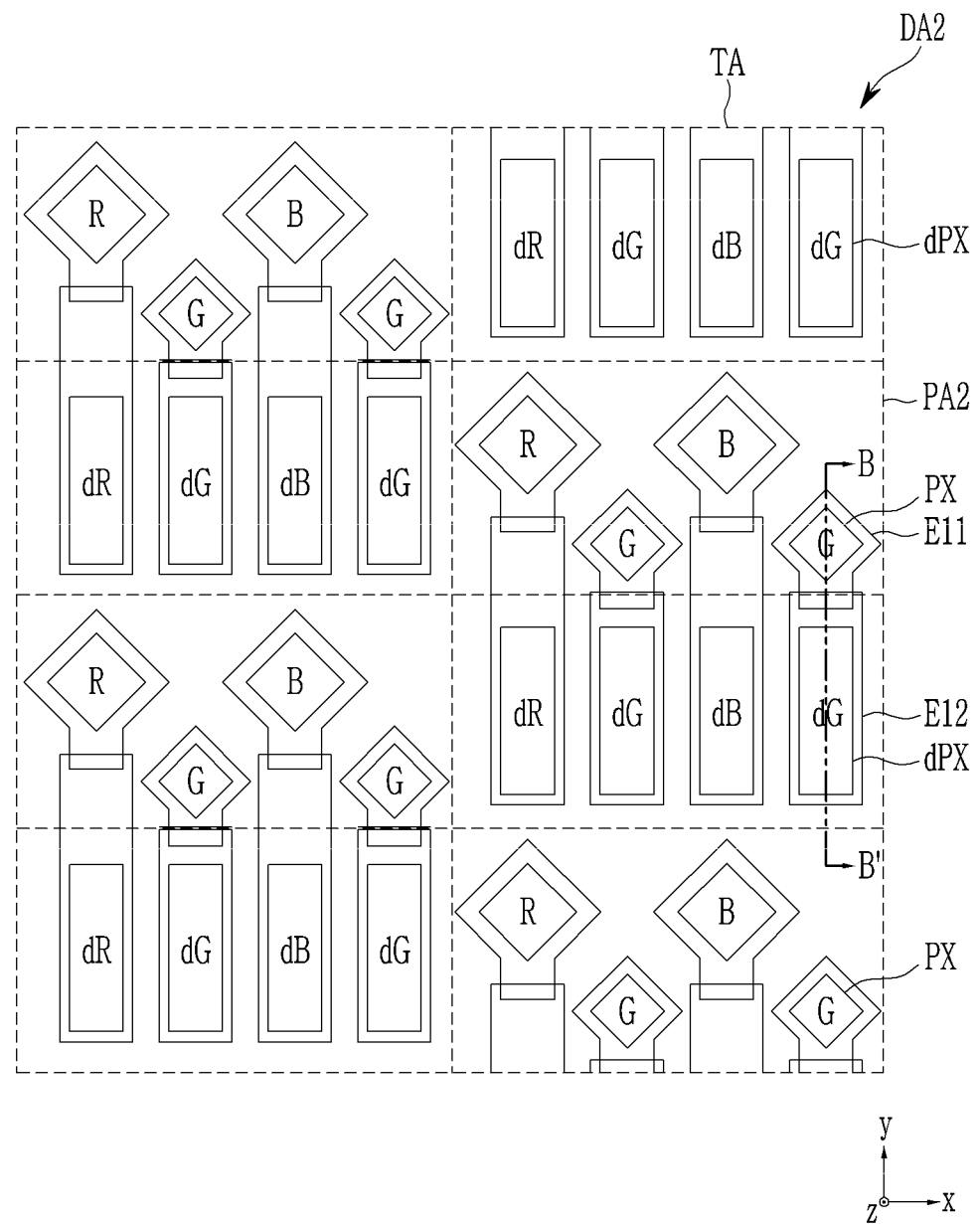
FIG. 10 is a schematic top plan view showing a part of a second display area in a display device according to some example embodiments.
Figure 11:
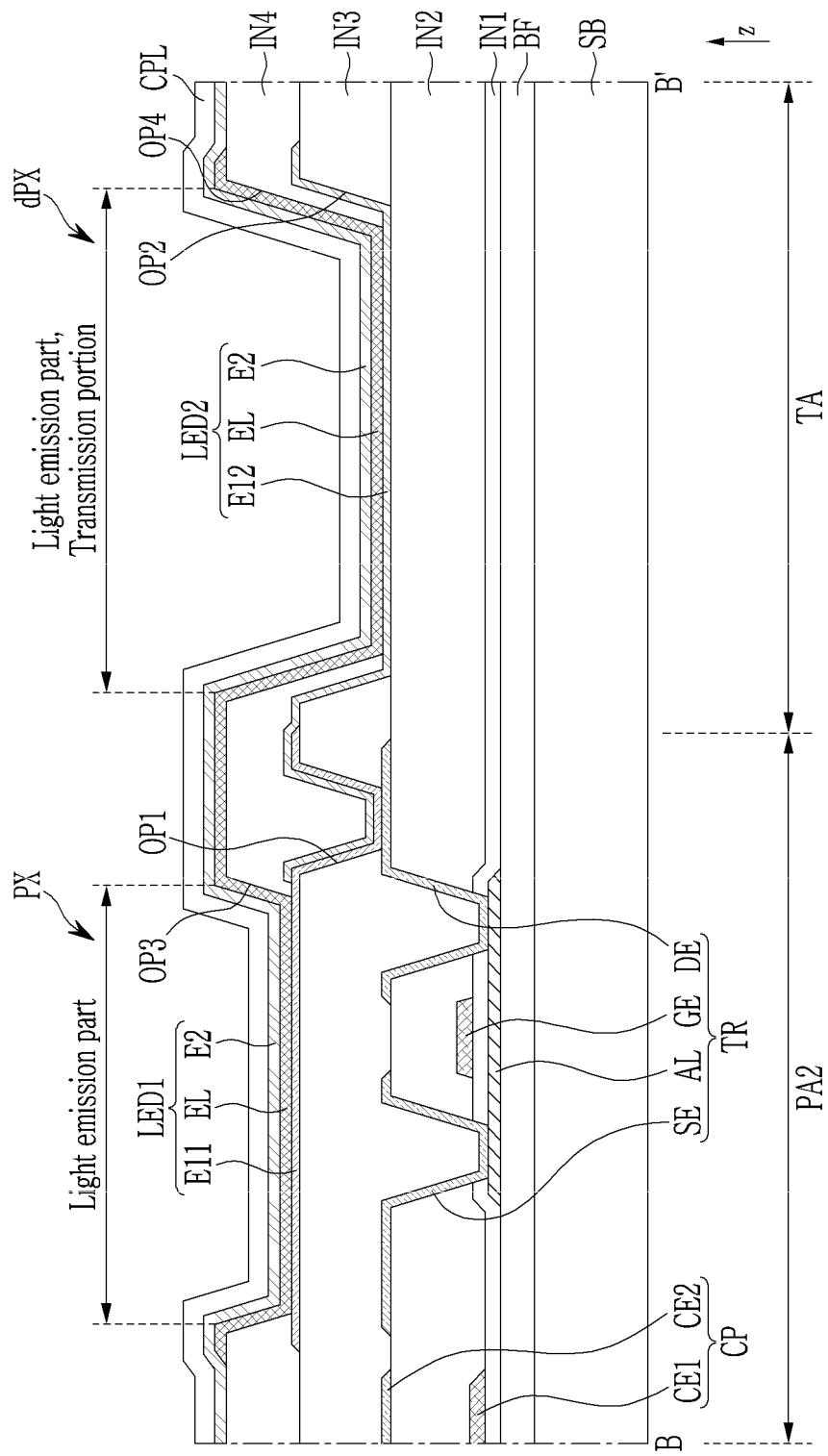
FIG. 11 is a cross-sectional view taken along a line B-B' in FIG. 10 according to some example embodiments.

FIG. 10 is a schematic top plan view showing a part of a second display area in a display device according to some example embodiments, and FIG. 11 is a cross-sectional view taken along a line B-B' in FIG. 10 according to some example embodiments.

Referring to FIG. 10 and FIG. 11, the first electrode E12 of the light emitting diode LED2 of the dummy pixel dPX located in the transmissive area TA is connected to the pixel circuit of the second pixel area PA2. The first electrode E12 may extend into the opening OP1, but may not extend. The first electrode E12 does not extend to the light emitting diode LED1 of the pixel PX in the second pixel area PA2. Therefore, the first electrode E11 does not include the second layer but only the first layer. In this design, the light emitting diode LED1 of the second pixel area PA2 may have substantially the same structure as the light emitting diode of the first pixel area PA1.

Figure 12:
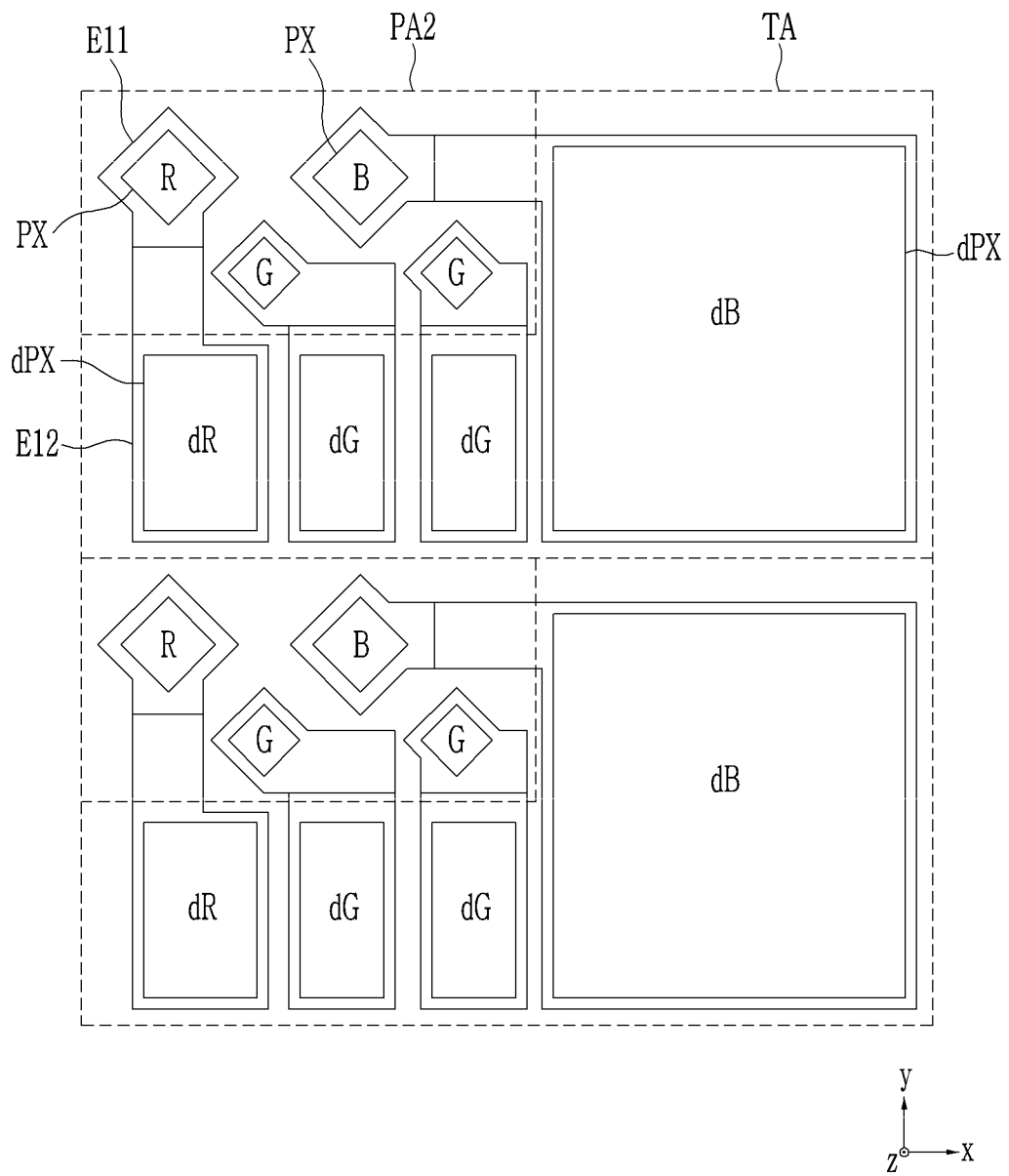
FIG. 12 is a schematic top plan view showing a part of a second display area in a display device according to some example embodiments.
Figure 13:
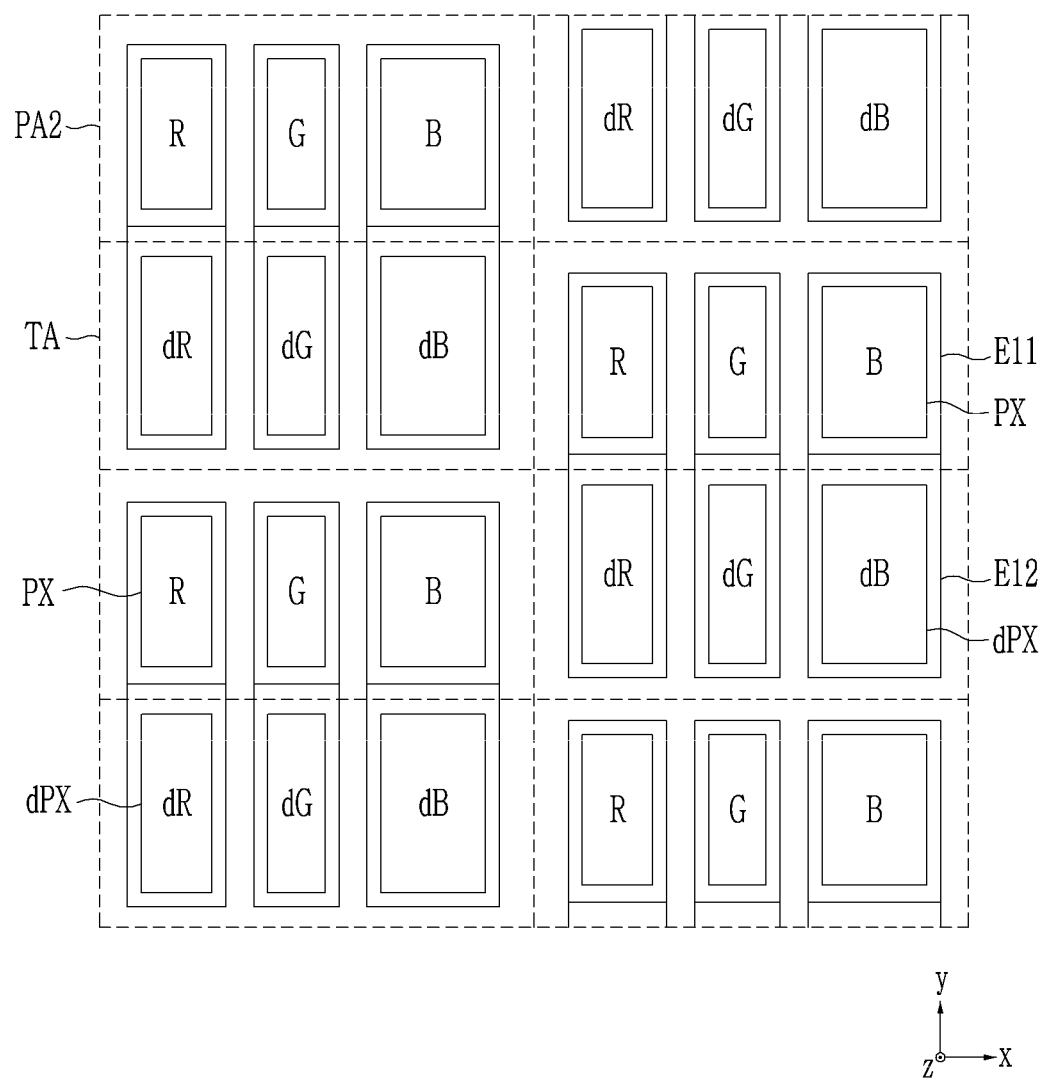
FIG. 13 is a schematic top plan view showing a part of a second display area in a display device according to some example embodiments.
Figure 14:
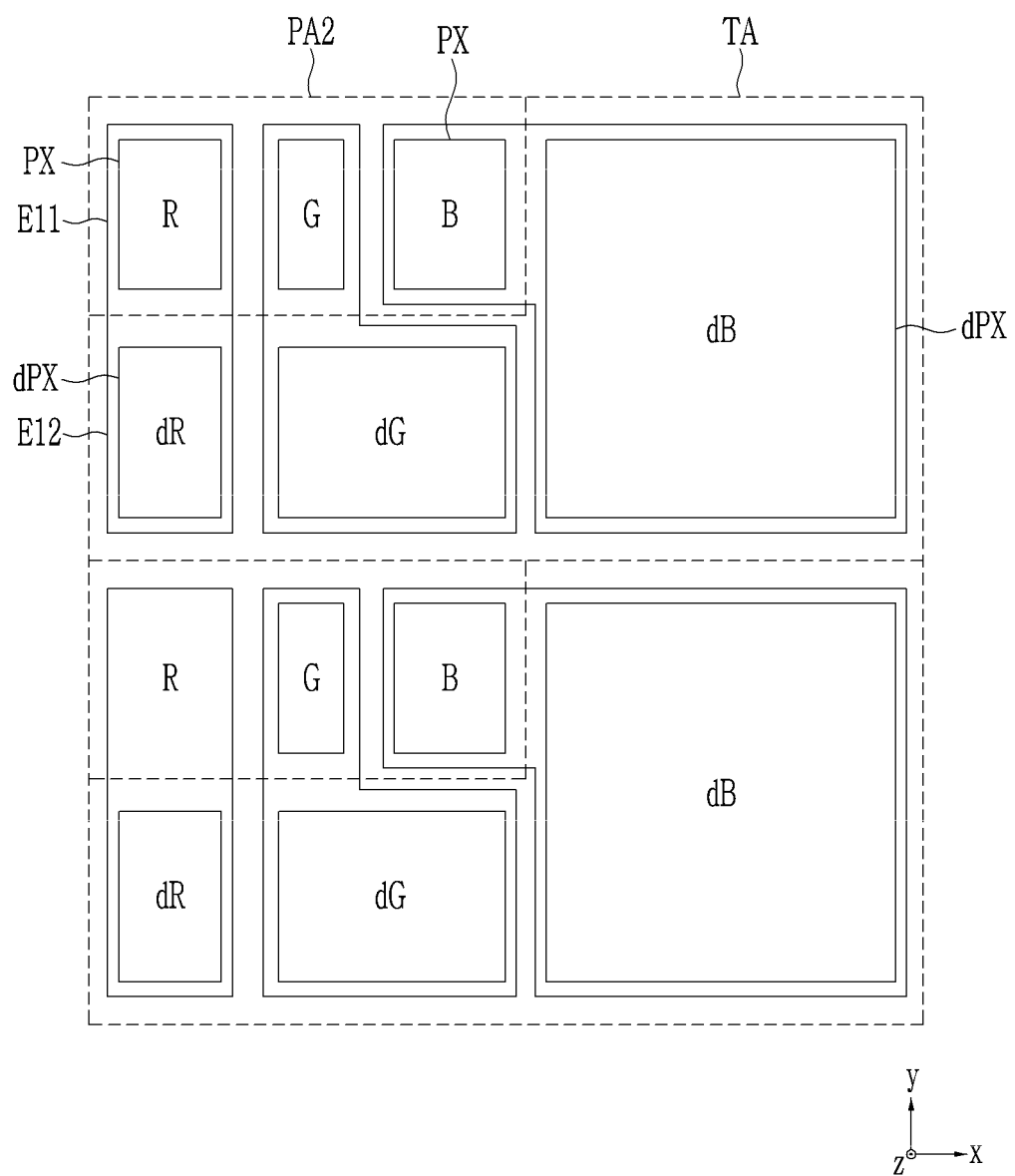
FIG. 14 is a schematic top plan view showing a part of a second display area in a display device according to some example embodiments.

FIG. 12, FIG. 13, and FIG. 14 are schematic top plan views showing a part of a second display area in a display device according to some example embodiments, respectively. Each example embodiment is described based on differences from the example embodiments described above.

Referring to FIG. 12, an example in which the area ratio of the transmissive area TA to the second pixel area PA2 is about 1:3, the pixel PX shape is a rhombus, and the dummy pixel dPX shape is a rectangle is shown. The shown area includes two second pixel areas PA2 and two transmissive areas TA. In this arrangement, the pixel density of the second display area DA2 may be about ¼ of the pixel density of the first display area DA1.

Each second pixel area PA2 may include the pixels PX, and the transmissive area TA may include the dummy pixels dPX. Because the transmissive area TA is wider than the second pixel area PA2, each dummy pixel dPX may be formed with a wider area than that of the above-described example embodiment in the transmissive area TA. For example, as above-described, in each transmissive area TA, one dummy red pixel dR and two dummy green pixels dG may be formed at the area approximately corresponding to one second pixel area PA2, and an dummy blue pixel dB may be formed at an area approximately corresponding to two second pixel areas PA2. According to some example embodiments, the dummy blue pixel dB which may be shorter in lifespan than the dummy red and green pixels dR and dG, may be formed to be relatively wider than the dummy red and green pixels dR and dG.

The dummy pixels dPX may include the light emission portion without including the pixel circuit. The dummy pixel dPX may be a double-sided emission type that emits light in the third direction z and the opposite direction −z thereto. The red, green, and dummy blue pixels dR, dG, and dB of the transmissive area TA are electrically connected to the pixel circuit of the corresponding red, green, and blue pixels R, G, and B of the second pixel area PA2, thereby being driven and emitted along with the red, green, and blue pixels R, G, and B. The first electrode E12 of the light-emitting element of the dummy pixel dPX may be electrically connected to the first electrode E11 of the light-emitting element of the pixel PX.

As shown in FIG. 12, a test result of the configuration of the second display area DA2 is briefly shown in Table 1 below.

TABLE 1

|  |  | First display area | Second display area | |
| --- | --- | --- | --- | --- |
|  |  |  | Example Embodiment | Comparative Example |
| Aperture ratio (%) | Red pixel | 17.64 | 40.66 | 4.41 |
|  | Green pixel | 23.59 | 54.61 | 5.90 |
|  | Blue pixel | 29.42 | 69.79 | 7.36 |
| Lifespan (h) | Luminance | 1018 | 911 | 133 |
|  | Color | 921 | 3780 | 294 |
|  | After image | 971 | 2749 | 228 |

In Table 1, the aperture ratio of the example embodiment is obtained by adding the aperture ratio of the pixels PX and the aperture ratio of the dummy pixels dPX in the second display area DA2. A comparative example is a case where the transmissive area TA does not include a dummy pixel dPX. According to some example embodiments, even though the pixel density of the second display area DA2 is approximately ¼ of the pixel density of the first display area DA1, it has been shown to improve the luminance lifespan of the pixel PX by about seven times higher than the comparative example by arranging the double-sided emission dummy pixel dPX in the transmissive area TA. Referring to FIG. 13, an example is shown in which the area ratio of the second pixel area PA2 to the transmissive area TA is approximately 1:1, and both the pixel PX and the dummy pixel dPX are rectangular. In this arrangement, the pixel density of the second display area DA2 may be approximately ½ of the pixel density of the first display area DA1.

Each second pixel area PA2 includes one red pixel R, one green pixel G, and one blue pixel B, and correspondingly, the transmissive area TA includes one dummy red pixel dR, one dummy green pixel dG, and one dummy blue pixel dB. The red, green, and blue dummy pixels dR, dG, and dB of the transmissive area TA are electrically connected to the pixel circuit of the corresponding red, green, and blue pixels R, G, and B of the second pixel area PA2, thereby being driven and emitted along with the red, green, and blue pixels R, G, and B.

On the other hand, the first pixel area PA1 of the first display area DA1 may include one red pixel R, two green pixels G, and one blue pixel B, may include one red pixel R, one green pixel G, and one blue pixel B, or may have other unit pixel configurations. In other words, the pixel configuration and the unit pixel of the second pixel area PA2 are not necessarily the same as the pixel configuration and the unit pixel of the first pixel area PA1.

Referring to FIG. 14, an example is shown in which the area ratio of the second pixel area PA2 to the transmissive area TA is approximately 1:3, and both the pixel PX and the dummy pixel dPX are rectangular. As shown, one dummy red pixel dR and one dummy green pixel dG may be located in the area approximately corresponding to one second pixel area PA2 in each transmissive area TA, and one dummy blue pixel dB may be located in the area approximately corresponding to two second pixel areas PA2. The dummy pixels dPX may not include the pixel circuit, but may only include the light emission portion, and the first electrode E12 of the light-emitting element of the dummy pixel dPX may be electrically connected to the first electrode E11 of the light-emitting element of the pixel PX. The dummy pixels dPX may be the double-sided emission type.

According to some example embodiments, the ratio and arrangement of the first pixel area PA1 and the transmissive area TA in the second display area DA2 and the arrangement of the pixels PX included in the first pixel area PA1 and the dummy pixels dPX included in the transmissive area TA may be variously changed. For example, in the second display area DA2, in the case that the ratio of the first pixel area PA1 and the transmissive area TA is about 1:15, one dummy red pixel dR may be located in the area corresponding to approximately three second pixel areas PA2, one or two dummy green pixels dG may be located in the area corresponding to approximately six second pixel areas PA2, and one dummy blue pixel dB may be arranged in the area corresponding to approximately six second pixel areas PA2. In either case, the both-sided emission type of dummy pixels dPX are also located in the transmissive area TA to ease the burden on the pixels PX of the second pixel area PA2, thereby reducing the lifespan deterioration of the pixels PX of the second display area DA2 due to the difference of the pixel density from the first display area DA1.

The pixel circuit that may be included in the pixels PX of the first and second pixel areas PA1 and PA2 is described as a circuit diagram.

Figure 15:
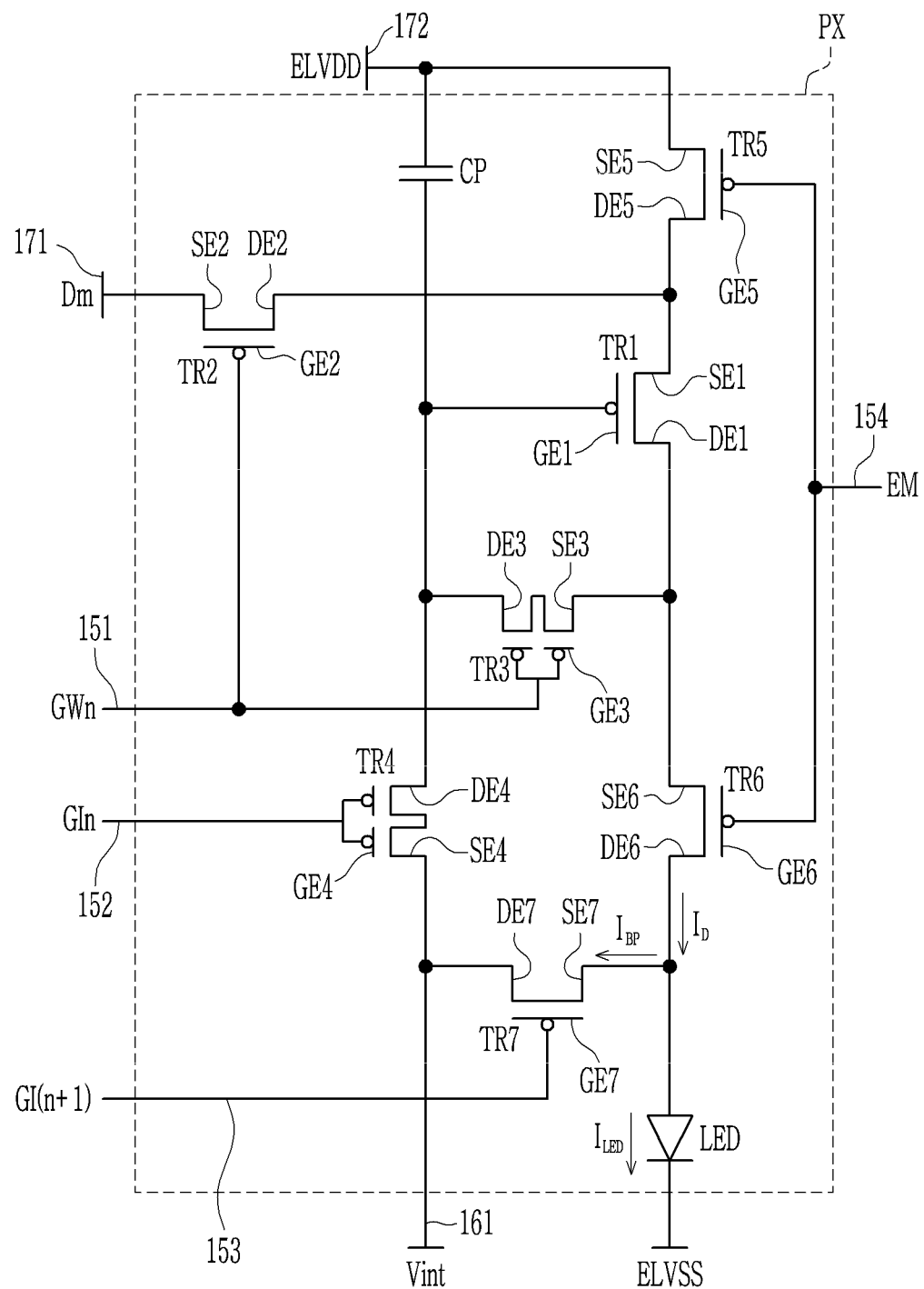
FIG. 15 is a circuit diagram of one pixel of a display device according to some example embodiments.

FIG. 15 is a circuit diagram of one pixel of a display device according to some example embodiments.

Referring to FIG. 15, one pixel PX may include the transistors TR1, TR2, TR3, TR4, TR5, TR6, and TR7, the capacitor CP, and the light emitting diode LED that are connected to signal lines 151, 152, 153, 154, 161, 171, and 172.

The signal lines 151, 152, 153, 154, 161, 171, and 172 may include gate lines 151, 152, and 153, a light emission control line 154, a data line 171, a driving voltage line 172, and an initialization voltage line 161.

The gate lines 151, 152, and 153 may transmit gate signals GWn, GIn, and GI(n+1), respectively. The gate signals GWn, GIn, and GI(n+1) may transmit a gate-on voltage and a gate-off voltage capable of turning the transistors TR2, TR3, TR4, and TR7 included in the pixel PX on/off.

The gate lines 151, 152, and 153 connected to one pixel PX may include a first gate line 151 capable of transmitting the gate signal GWn, a second gate line 152 capable of transmitting the gate signal GIn having the gate-on voltage at a different time from that of the first gate line 151, and a third gate line 153 capable of transmitting a gate signal GI(n+1). The second gate line 152 may transmit the gate-on voltage at an earlier time than the first gate line 151. For example, when the gate signal GWn is the n-th gate signal among the gate signals applied during one frame, the gate signal GIn may be a previous gate signal such as a (n−1)-th gate signal, and the gate signal GI(n+1) may be the n-th gate signal. The gate signal GI(n+1) may be a different gate signal from the n-th gate signal.

The light emission control line 154 may transmit a light emission control signal EM capable of controlling the emission of the light emitting diode LED. The light emission control signal EM may include the gate-on voltage and the gate-off voltage.

The data line 171 may transmit a data signal Dm. The driving voltage line 172 may transmit a driving voltage ELVDD. The data signal Dm may have different voltage levels according to an image signal input to the display device, and the driving voltage ELVDD may have a substantially constant level. The initialization voltage line 161 may transmit a constant voltage such as an initialization voltage Vint.

The display device may include a driving device (e.g., a gate driver, a data driver, a signal controller, etc.) for generating the signals transmitted to the signal lines 151, 152, 153, 154, 161, 171, and 172.

The transistors TR1, TR2, TR3, TR4, TR5, TR6, and TR7 included in one pixel PX may include a first transistor TR1, a second transistor TR2, a third transistor TR3, a fourth transistor TR4, a fifth transistor TR5, a sixth transistor TR6, and a seventh transistor TR7.

The first gate line 151 may transmit the gate signal GWn to the second transistor TR2 and the third transistor TR3. The second gate line 152 may transmit the gate signal GIn to the fourth transistor TR4. The third gate line 153 may transmit the gate signal GI(n+1) to the seventh transistor TR7. The light emission control line 154 may transmit the light emission control signal EM to the fifth transistor TR5 and the sixth transistor TR6. The transistors TR1, TR2, TR3, TR4, TR5, TR6, and TR7 may include source electrodes SE1, SE2, SE3, SE4, SE5, SE6, and SE7, drain electrodes DE1, DE2, DE3, DE4, DE5, DE6, and DE7, and gate electrodes GE1, GE2, GE3, GE4, GE5, GE6, and GE7, respectively, and are connected as shown.

The first transistor TR1 may receive the data signal Dm transmitted by the data line 171 depending on the switching operation of the second transistor TR2 to supply a current $I_{LED}$ to the light emitting diode LED.

The second transistor TR2 may be turned on according to the gate signal GWn transmitted through the first gate line 151 to transmit the data signal Dm transmitted from the data line 171 to the source electrode SE1 of the first transistor TR1. That is, the first transistor TR1 may be configured to receive, at a first electrode, the data signal Dm through the second transistor TR2, based on the gate signal Gwn turning on the second transistor TR2.

The third transistor TR3 may also be turned on according to the gate signal GWn transmitted through the first gate line 151 to connect the gate electrode GE1 and the drain electrode DE1 of the first transistor TR1 to each other, thereby diode-connecting the first transistor TR1. Thus, according to some example embodiments, the third transistor TR3 may be activated to turn on concurrently with the second transistor TR2.

The fourth transistor TR4 may be turned on according to the gate signal GIn transmitted through the second gate line 152 to transmit the initialization voltage Vint to the gate electrode GE1 of the first transistor TR1, thereby performing an initialization operation for initializing the voltage of the gate electrode GE1 of the first transistor TR1.

The fifth transistor TR5 and the sixth transistor TR6 are concurrently (e.g., simultaneously) turned on according to the light emission control signal EM transmitted through the light emission control line 154, thereby the driving voltage ELVDD is compensated through the diode-connected first transistor TR1 and transmitted to the light emitting diode LED.

One terminal of the capacitor CP may be connected to the gate electrode GE1 of the first transistor TR1, and the other terminal may be connected to the driving voltage line 172. The cathode of the light emitting diode LED is connected to a common voltage terminal that transmits a common voltage ELVSS, thereby receiving the common voltage ELVSS.

The number of transistors and the number of capacitors included in one pixel PX and the connection relationship thereof may be changed in various ways.

The operation of the display device according to some example embodiments is briefly described as follows. During an initialization period, if the gate signal Gin of the gate-on voltage level is supplied through the second gate line 152 (the gate signal Gin may be the (n−1)-th gate signal), the fourth transistor TR4 is turned on, the initialization voltage Vint is transmitted to the gate electrode GE1 of the first transistor TR1 through the fourth transistor TR4, and the first transistor TR1 is initialized by the initialization voltage Vint.

Next, during a data programming and compensation period, if the gate signal GWn of the gate-on voltage level is supplied through the first gate line 151 (the gate signal GWn may be the n-th gate signal), the second transistor TR2 and the third transistor TR3 are turned on. The first transistor TR1 is diode-connected by the turned-on third transistor TR3 and is biased forward. Then, the compensation voltage reduced by the threshold voltage of the first transistor TR1 from the data signal Dm supplied through the data line 171 is applied to the gate electrode GE1 of the first transistor TR1. The driving voltage ELVDD and the compensation voltage are applied to both terminals of the capacitor CP, and a charge corresponding to the voltage difference between the both terminals of the capacitor CP may be stored.

Next, during a light emission period, if the light emission control signal EM supplied from the light emission control line 154 is changed from the gate-off voltage level into the gate-on voltage level, the fifth transistor TR5 and the sixth transistor TR6 are turned on, a driving current ID depending on the voltage difference between the gate voltage of the gate electrode GE1 of the driving first transistor TR1 and the driving voltage ELVDD is generated, and the driving current ID is supplied to the light emitting diode LED through the sixth transistor TR6 so that the current $I_{LED}$ flows to the light emitting diode LED.

On the other hand, during an initialization period, the seventh transistor TR7 is turned on by receiving the gate signal GI(n+1) of the gate-on voltage level through the third gate line 153. The gate signal GI(n+1) may be the n-th gate signal. Part of the driving current ID may be bypassed through the seventh transistor TR7 as a bypass current IBP by the turned-on seventh transistor TR7.

Figure 16:
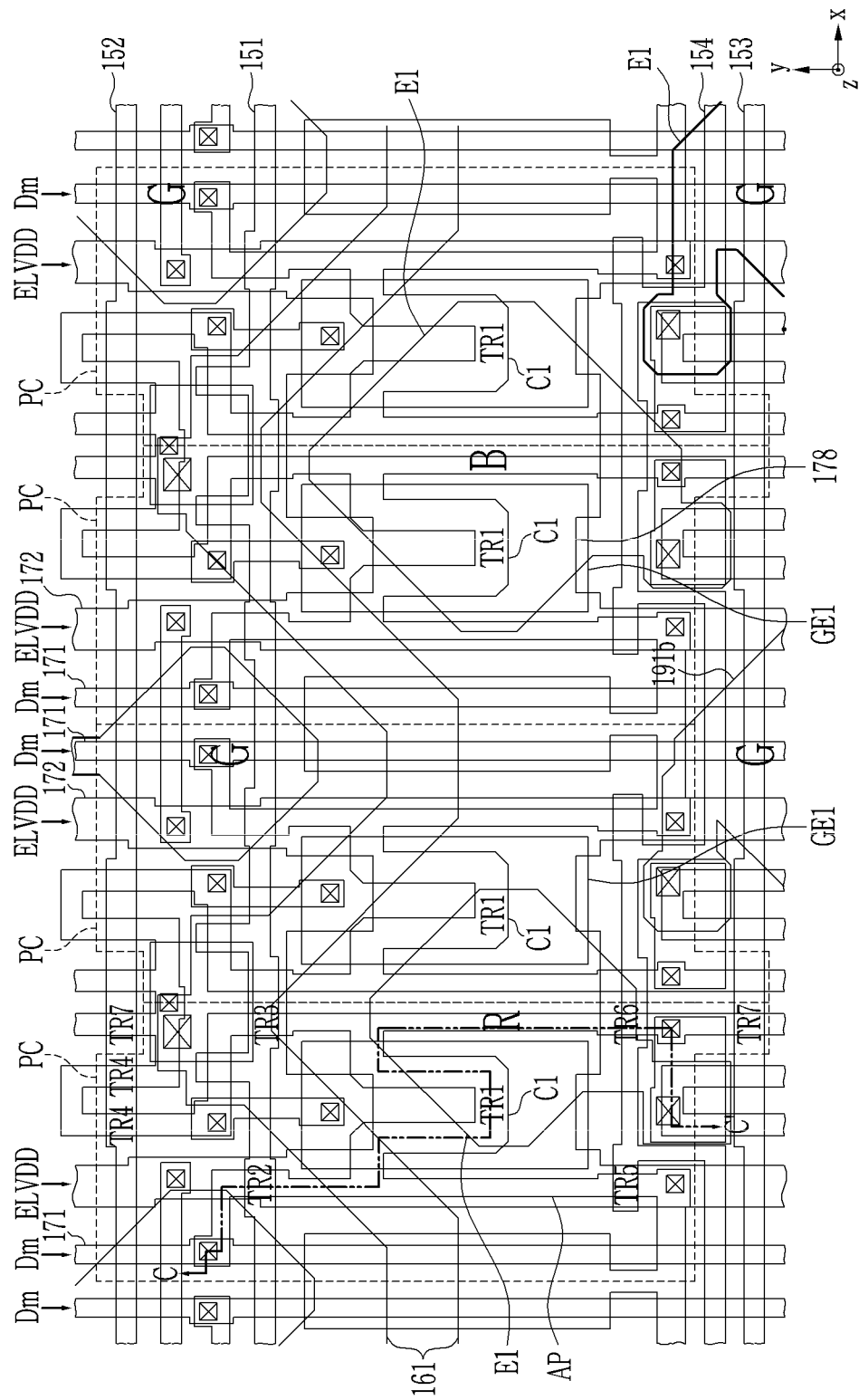
FIG. 16 is a layout view of a display area of a display device according to some example embodiments.
Figure 17:
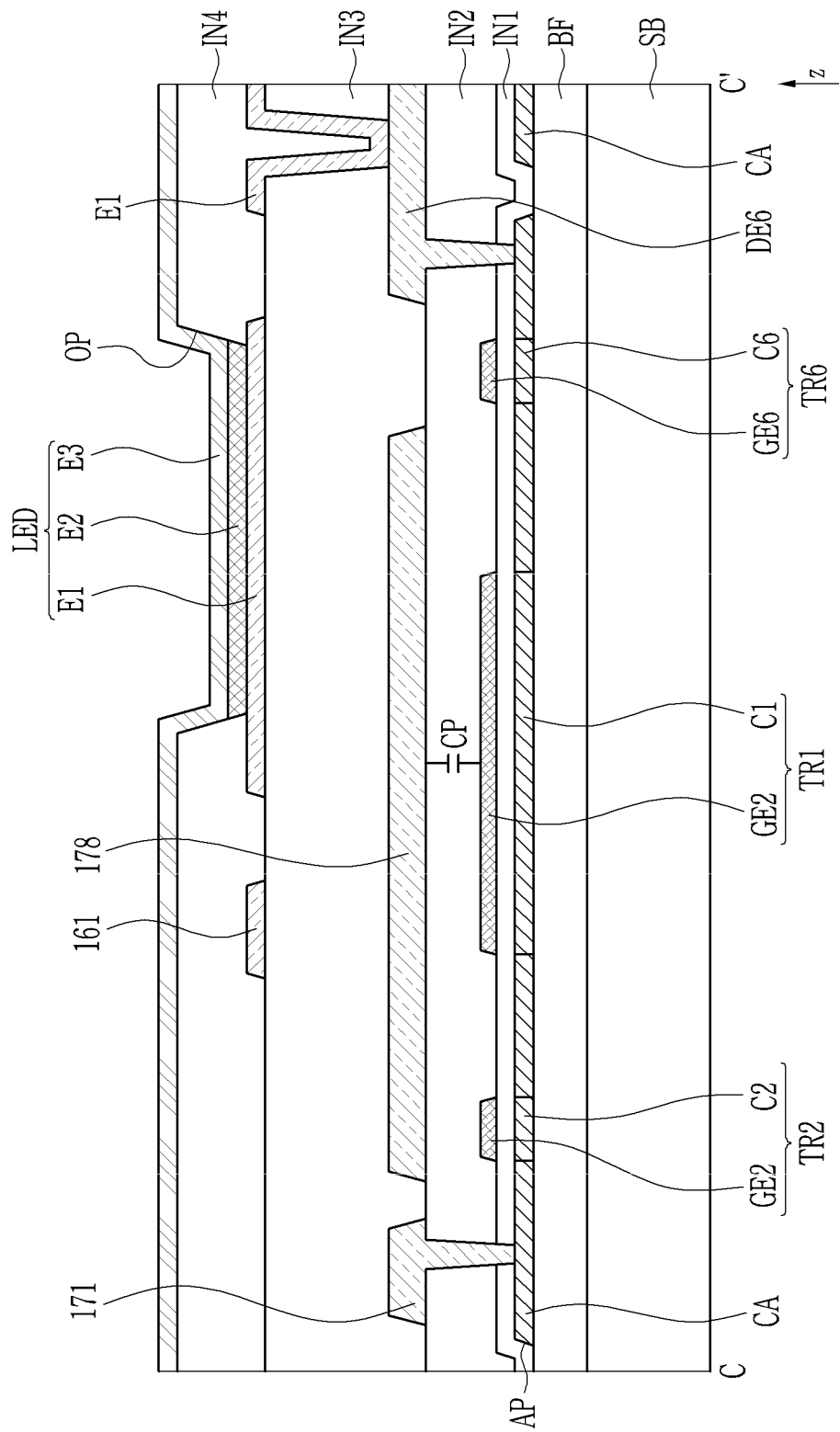
FIG. 17 is a cross-sectional view taken along a line C-C' in FIG. 16 according to some example embodiments.

FIG. 16 is a layout view of a display area of a display device according to some example embodiments, and FIG. 17 is a cross-sectional view taken along a line C-C' in FIG. 16 according to some example embodiments. The shown layout view may be one example of the first pixel area PA1 and/or the second pixel area PA2.

Referring to FIG. 16, the display device according to some example embodiments may include pixel circuits PC corresponding to the pixels R, G, and B. The pixel circuits PC may be arranged in a matrix arrangement.

The pixel circuit PC may include the transistors TR1, TR2, TR3, TR4, TR5, TR6, and TR7, which are connected to the gate lines 151, 152, and 153, the light emission control line 154, the data line 171, the driving voltage line 172, and the initialization voltage line 161. The gate lines 151, 152, and 153 and the light emission control line 154 may extend approximately in the first direction x, and the data line 171, the driving voltage line 172, and the initialization voltage line 161 may extend approximately in the second direction y. The driving voltage line 172 and/or the initialization voltage line 161 may be in the form of a mesh. The driving voltage line 172 may include an extension 178.

A channel of each transistor TR1, TR2, TR3, TR4, TR5, TR6, and TR7 may be formed inside an active pattern AP. The active pattern AP may be curved in various shapes. For example, the first transistor TR1 may include the channel area C1 of the active pattern AP that is bent at least once. The first transistor T1 of the second pixel area PA2 must drive the dummy pixel dPX of the transmissive area TA as well as the pixel PX of the second pixel area PA2 together, or may drive the pixel PX of the second pixel area PA2 so as to represent a higher luminance than that of the pixel PX of the first pixel area PA1. Accordingly, the first transistor T1 located in the second pixel area PA2 may have a larger channel area C1 than that of the first transistor T1 located in the first pixel area PA1.

Referring to FIG. 16 and FIG. 17, the display device according to some example embodiments includes the substrate SB, and the buffer layer BF may be located on the substrate SB.

An active pattern AP may be located on the buffer layer BF. The active pattern AP may include channel areas C1, C2, and C6 and a conductive area CA. The conductive area CA is located on both sides of each channel area C1, C2, and C6, and may be the source area and the drain area of the transistor.

A first insulating layer IN1 may be formed on the active pattern AP, and a first conductive layer that may include the gate lines 151, 152, and 153, the light emission control line 154, and the gate electrodes GE1, GE2, and GE6 may be located on the first insulating layer IN1.

A second insulating layer IN2 may be formed on the first conductive layer. A second conductive layer, which may include the data line 171, the driving voltage line 172, and the drain electrode DE6, may be formed on the second insulating layer IN2. The data line 171 may be connected to the source area of the second transistor TR2 through the opening of the first and second insulating layers IN1 and IN2. The extending part 178 of the driving voltage line 172 may overlap the gate electrode GE1 of the first transistor TR1 via the second insulating layer IN2 interposed therebetween, thereby configuring the capacitor CP. The drain electrode DE6 may be connected to the drain area of the sixth transistor TR6 through the opening of the first and second insulating layers IN1 and IN2.

The third insulating layer IN3 may be formed on the second conductive layer. A third conductive layer that may include the first electrode E1 of the pixels R, G, and B, the initialization voltage line 161, etc., may be formed on the third insulating layer IN3. The first electrode E1 may be connected to the drain electrode DE6 through the opening of the third insulating layer IN3. The third conductive layer may be reflective or translucent.

A fourth insulating layer IN4 may be located on the third conductive layer. The fourth insulating layer IN4 may have the opening OP overlapping the first electrode E1. The light emission member EL located within at least the opening OP may be located on the first electrode E1. A second electrode E2 may be located on the light emission member EL and the fourth insulating layer IN4. The second electrode E2 may be transparent.

The first electrode E1, the light emission member EL, and the second electrode E2 of each pixel R, G, and B may form the light emitting diode LED of the light-emitting element.

The first display area DA1 described above may have a structure shown in FIG. 16 and FIG. 17. The second pixel area PA2 of the second display area DA2 may have substantially the same structure thereof. In the transmissive area TA of the second display area DA2, the pixel circuit PC for driving the light emitting diode LED may not be arranged or may be nearly arranged. For example, in the transmissive area TA, the transistors TR1, TR2, TR3, TR3, TR4, TR5, TR5, and TR7, and the capacitor CP, may not be arranged. Also, in the transmissive area, at least part of each signal line 151, 152, 153, 154, 161, 171, and 172 may not be formed. Accordingly, the transmittance of the transmissive area TA may be higher than the transmittance of the pixel areas PA1 and PA2. However, in the transmissive area TA, as described above, as the light emitting diode LED2 may be formed to be emitted along with the light emitting diode LED1 of the second pixel area PA2, the luminance deterioration of the second display area DA2 and the reduction of the lifespan of the pixels of the second pixel area PA2 due to the difference in the pixel density from the first display area DA1 may be improved.

While aspects of some example embodiments according to the present invention have been described in connection with what is presently considered to be practical example embodiments, it is to be understood that embodiments according to the present invention are not limited to the disclosed embodiments. On the contrary, it is intended to cover various modifications and equivalent arrangements included within the spirit and scope of the appended claims, and their equivalents.

What is claimed is:

1. A display device comprising:
a first display area including a first pixel area;
a second display area including a plurality of second pixel areas and a plurality of transmissive areas adjacent to corresponding ones of the second pixel areas, wherein the second pixel areas and the transmissive areas alternate along a row direction;
a first pixel in the first pixel area;
a second pixel in a second pixel area from among the second pixel areas; and
a dummy pixel in a transmissive area from among the transmissive areas,
wherein the dummy pixel includes a light emission portion emitting light on both sides.

2. The display device of claim 1, wherein
a pixel density of the second display area is smaller than a pixel density of the first display area.

3. The display device of claim 1, wherein
the dummy pixel is electrically connected to the second pixel.

4. The display device of claim 3, wherein
the dummy pixel represents a same color as the second pixel.

5. The display device of claim 3, wherein
a plurality of second pixels are in the second pixel area, and a plurality of dummy pixels corresponding to the plurality of second pixels is in the transmissive area.

6. The display device of claim 3, wherein
the second pixel includes a transistor and a first light-emitting element,
the dummy pixel includes a second light-emitting element, and
the second light-emitting element is electrically connected to the transistor of the second pixel.

7. The display device of claim 6, further comprising
a capping layer covering the first light-emitting element and the second light-emitting element, and
wherein the capping layer includes a first portion overlapping the first light-emitting element and a second portion overlapping the second light-emitting element, and a thickness of the first portion is smaller than a thickness of the second portion.

8. The display device of claim 6, wherein
the first light-emitting element includes a first electrode, a second electrode, and a light emission member between the first electrode and the second electrode,
the second light-emitting element includes a first electrode, a second electrode, and a light emission member between the first electrode and the second electrode, and
the first electrode of the second light-emitting element is electrically connected to the first electrode of the first light-emitting element.

9. The display device of claim 8, wherein
the second electrode of the first light-emitting element and the second electrode of the second light-emitting element extend continuously over the second pixel area and the transmissive area.

10. The display device of claim 8, wherein
the light emission member of the first light-emitting element and the light emission member of the second light-emitting element extend continuously over the second pixel area and the transmissive area.

11. The display device of claim 8, wherein
the first electrode of the first light-emitting element is a reflective electrode, and the first electrode of the second light-emitting element is a transparent electrode.

12. The display device of claim 8, wherein
the first electrode of the first light-emitting element includes a first layer and a second layer, and
the second layer is integrally formed with the first electrode of the second light-emitting element.

13. The display device of claim 12, wherein
the first layer is reflective and the second layer is transmissive.

14. The display device of claim 1, wherein
a planar shape of the light emission portion of the first pixel and a planar shape of the light emission portion of the second pixel are different from each other.

15. The display device of claim 1, further comprising
an optical device overlapping the second display area, and
the second display area has higher transmittance than the first display area.

16. A display device comprising:
a plurality of pixel areas each including a pixel including a first light-emitting element and a transistor; and
a plurality of transmissive areas adjacent to corresponding ones of the pixel areas and each including a dummy pixel including a second light-emitting element, wherein the pixel areas and the transmissive areas alternate along a row direction, wherein each of the first light-emitting element and the second light-emitting element includes a first electrode, a light emission member on the first electrode, and a second electrode on the light emission member, and the first electrode and the second electrode of the second light-emitting element are transparent electrodes.

17. The display device of claim 16, wherein the first electrode of the first light-emitting element and the first electrode of the second light-emitting element are electrically connected to the transistor.

18. The display device of claim 17, wherein the first electrode of the first light-emitting element includes a first layer and a second layer on the first layer, and the second layer is integrally formed with the first electrode of the second light-emitting element.

19. The display device of claim 16, further comprising a capping layer covering the first light-emitting element and the second light-emitting element, and the capping layer includes a first portion overlapping the first light-emitting element and having a first thickness, and a second portion overlapping the second light-emitting element and having a second thickness that is smaller than the first thickness.

20. The display device of claim 16, wherein a ratio of a pixel area from among the pixel areas to a transmissive area from among the transmissive areas is $1:n$, $1:2n-1$, or $1:2^n-1$, wherein n is a natural number.

* * * * *